US009928336B1

(12) United States Patent
Yuan

(10) Patent No.: US 9,928,336 B1
(45) Date of Patent: Mar. 27, 2018

(54) METHODS, SYSTEMS, AND ARTICLES OF MANUFACTURE FOR SIMPLIFYING AN ELECTRONIC DESIGN FOR VERIFICATION BY DOMAIN REDUCTION

(71) Applicant: Cadence Design Systems, Inc., San Jose, CA (US)

(72) Inventor: Jun Yuan, Pleasanton, CA (US)

(73) Assignee: Cadence Desisgn Systems, Inc., San Jose, CA (US)

(*) Notice: Subject to any disclaimer, the term of this patent is extended or adjusted under 35 U.S.C. 154(b) by 234 days.

(21) Appl. No.: 14/793,723

(22) Filed: Jul. 7, 2015

(51) Int. Cl.
*G06F 17/50* (2006.01)
(52) U.S. Cl.
CPC ...... *G06F 17/5081* (2013.01); *G06F 17/5045* (2013.01)
(58) Field of Classification Search
CPC .............. G06F 17/5081; G06F 17/5045
USPC .............................. 716/113
See application file for complete search history.

(56) References Cited

U.S. PATENT DOCUMENTS

| 7,246,331 | B2* | 7/2007 | Ward | G06F 17/5045 716/106 |
| 7,788,646 | B2* | 8/2010 | Ward | G06F 17/504 716/106 |
| 8,234,604 | B2* | 7/2012 | El-Zein | G06F 17/505 716/100 |
| 8,527,924 | B2* | 9/2013 | Drane | G06F 17/505 703/16 |
| 8,966,457 | B2* | 2/2015 | Ebcioglu | G06F 17/5045 716/105 |

OTHER PUBLICATIONS

Bjesse, Per. "A practical approach to word level model checking of industrial netlists." International Conference on computer Aided Verification. Springer, Berlin, Heidelberg, 2008.
Pnueli, Amir, et al. "The small model property: How small can it be?." Information and computation 178.1 (2002): 279-293.
Bryant, Randal E., Steven German, and Miroslav N. Velev. "Exploiting positive equality in a logic of equality with uninterpreted functions." International Conference on Computer Aided Verification. Springer, Berlin, Heidelberg, 1999.

* cited by examiner

*Primary Examiner* — Jack Chiang
*Assistant Examiner* — Brandon Bowers
(74) *Attorney, Agent, or Firm* — Vista IP Law Group, LLP

(57) ABSTRACT

Disclosed are techniques for simplifying an electronic design for verification by domain reduction. These techniques extract one or more data flows for at least a portion of an electronic design under verification, construct a comparison graph comprising tokens and edges for the at least the portion of the electronic design, color the comparison graph with a number of colors, and reduce a domain size of the at least the portion of the electronic design based in part or in whole upon the number of colors.

28 Claims, 17 Drawing Sheets

500A
CLOCK CYCLE #1: $a = b$
CLOCK CYCLE #2: $a \neq b \ \& \ a = c$
CLOCK CYCLE #3: $a \neq b \ \& \ a \neq c \ \& \ a = d$
FIG. 5A
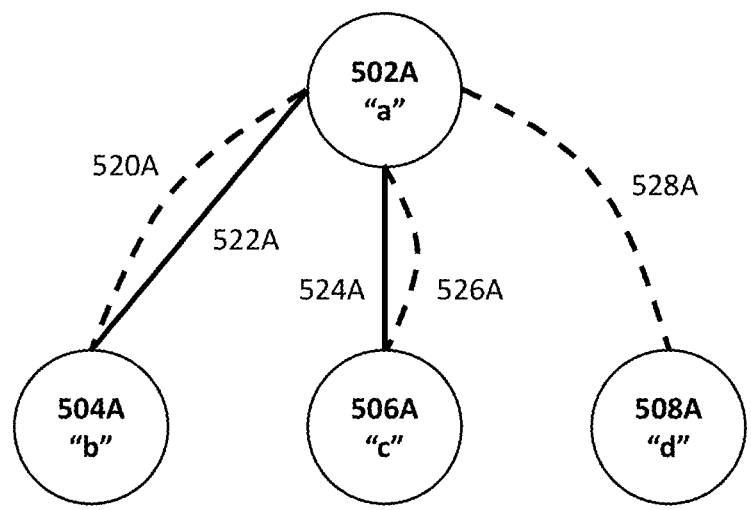
FIG. 5B
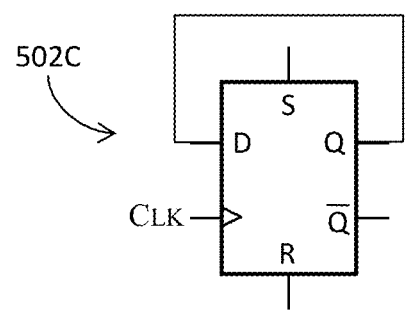
FIG. 5C

|  | a | b | c | d |
|---|---|---|---|---|
| Clk Cycle #1 | 0 | 0 | | |
| Clk Cycle #2 | 1 | 0 | 1 | |
| Clk Cycle #3 | 2 | 0 | 1 | 2 |

METHODS, SYSTEMS, AND ARTICLES OF MANUFACTURE FOR SIMPLIFYING AN ELECTRONIC DESIGN FOR VERIFICATION BY DOMAIN REDUCTION

BACKGROUND

During verification, verification tools may receive a connectivity specification that captures the source signal, the destination signal, and the condition (e.g., conditions due to multiplexers) and/or latency (e.g., timing delay due to flip-flops) in which the source and destination signals are connected. The specification may be further translated into a property to be proved or disproved by the verification tools. During a verification flow for a data flow network, one piece of data is transmitted within the network and is compared with one or more other pieces of data to determine whether one or properties may be proved or disproved or one or more states may be reachable.

Conventional verification approaches compare the values of variables representing data propagating within a network. For example, these conventional verification approaches use 256 values for comparisons of 8-bit variables or words. With the increasing complexities of modern electronic designs and hence the numerosity and complexity of properties to be verified, a challenge arose in domain reduction where several attempts have been made to reduce the data flow and thus the size of the domain for verification.

Modern electronic designs such as various general purpose processors, embedded systems, special purpose processors not only have more substantially more circuit components and more complex logic but also a longer word size (e.g., 64-bit, 128-bit, etc.) The increasing number of circuit components, more complex logic, and increasing widths of data further exacerbate the performance of verification tools due to the ever increasing domain sizes of modern electronic designs.

Therefore, there exists a need for a method, system, and computer program product for simplifying an electronic design for verification by domain reduction.

SUMMARY

Disclosed are method(s), system(s), and article(s) of manufacture for simplifying an electronic design for verification by domain reduction in various embodiments. Some first embodiments are directed at a method for simplifying an electronic design for verification by domain reduction. In these first embodiments, one or more data flows may be extracted for at least a portion of an electronic design under verification, and a comparison graph comprising a plurality of tokens and a plurality of edges may be constructed for the at least the portion of the electronic design. In addition, the comparison graph with a number of colors may be colored, and the domain size of the at least the portion of the electronic design may be reduced based in part or in whole upon the number of colors.

Some embodiments are directed at one or more hardware mechanisms that include and/or function in conjunction with at least one micro-processor as well as other related components or architectures of one or more computing systems and may be invoked to perform any of the methods, processes, or sub-processes disclosed herein. The hardware system may include one or more variants of a coupling detection mechanism, a shape processing mechanism, a factitious trace mechanism, a factitious trace marking mechanism, a coupled trace grouping mechanism, and/or one or more analysis or simulation mechanisms in some embodiments.

Each of these mechanisms may include or function in tandem with electrical circuitry and one or more micro-processors each having one or more processor cores of a general purpose computer to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. To the extent that a mechanism described herein includes a software portion, the compiled version of the software portion is stored in some non-transitory computer accessible storage medium (e.g., random access memory) and executed by at least one computer processor or processor core to perform its intended functions. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for simplifying an electronic design for verification by domain reduction are described below with reference to FIGS. 1-6.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 4B-1-4B-3 illustrate some examples of constructing a comparison graph for the portion of the electronic design illustrated in FIG. 4A in one or more embodiments.

FIG. 4C-1 illustrates a simplified schematic representation of another portion of an electronic design to which some techniques described herein apply in one or more embodiments.

FIG. 4C-2 illustrates a simplified schematic representation of another portion of an electronic design to which some techniques described herein apply in one or more embodiments.

FIG. 5A illustrates some examples of data flows of a portion of a simplified electronic design in one or more embodiments.

FIG. 5B illustrates an example of a comparison graph for those examples of data flows illustrated in FIG. 5A in one or more embodiments.

FIG. 5C illustrates an example of a circuit component for those examples of data flows illustrated in FIG. 5A in one or more embodiments.

DETAILED DESCRIPTION

Figure 1:
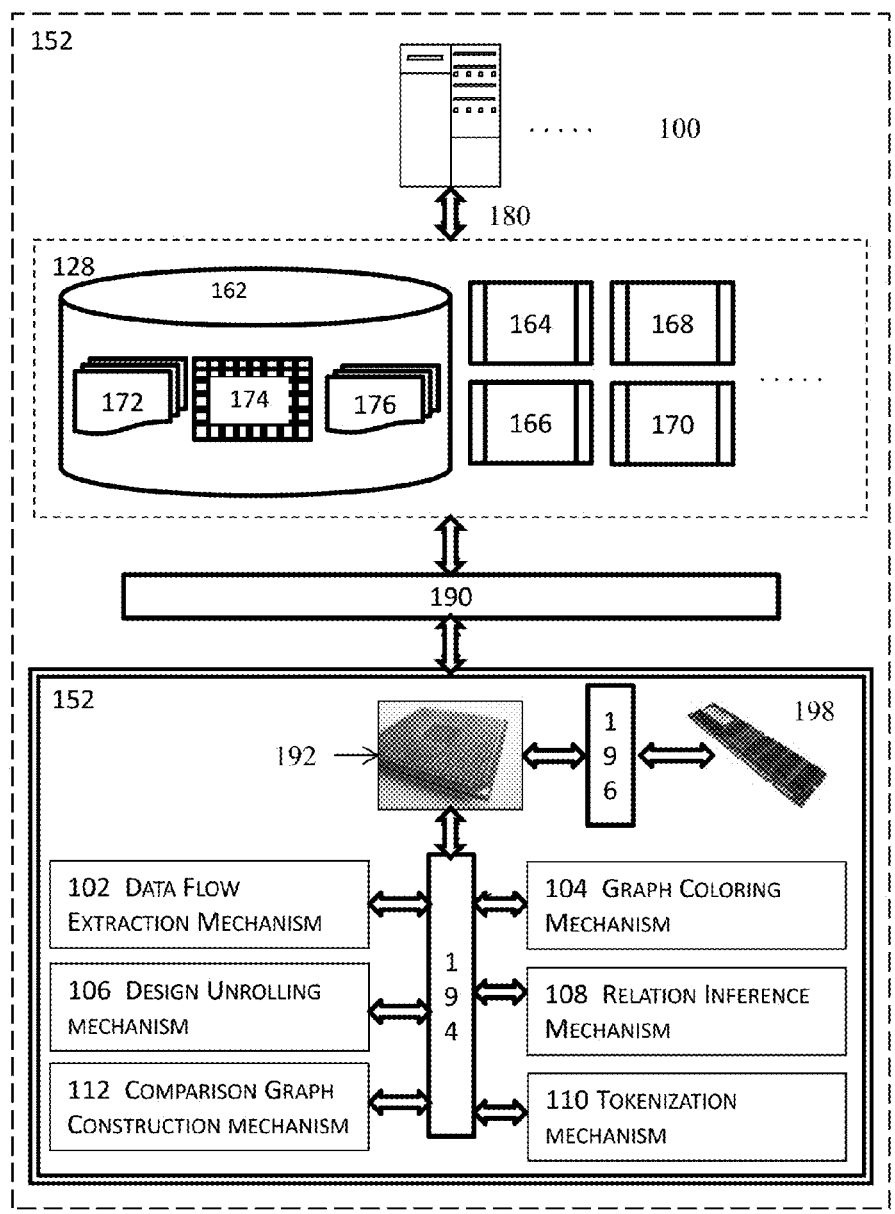
FIG. 1 illustrates a high level schematic block diagram for simplifying an electronic design for verification by domain reduction in one or more embodiments.

Various embodiments are directed to a method, system, and computer program product for simplifying an electronic design for verification by domain reduction. Other objects, features, and advantages of the invention are described in the detailed description, figures, and claims. Some embodiments extract data flows from at least a portion of an electronic design under verification and construct a comparison graph or a dependency graph by using these extracted data flows. A comparison graph of a portion of an electronic design includes a plural of vertices some of which are connected by edges. The distinct signals flowing through the portion of the electronic design may be used as the vertices of the comparison graph, and an edge may be inserted between two vertices when the signals corresponding to these two vertices are directly or indirectly compared.

Throughout this application the terms "comparison graph" and "dependency graph" are used interchangeably and may be collectively referred to as a comparison graph. A number of colors (e.g., the minimum number of colors or any number resulting in domain size reduction yet greater than the minimum number of colors) to color the comparison graph according to the extracted data flows may be determined. The number of colors may be represented as a multi-bit token that may be further utilized during the verification of at least the portion of the electronic design under verification, rather than using the actual signals or signal values. The domain size of at least the portion of the electronic design under verification may be reduced based in part or in whole upon the determined number of colors. More details about various aspects of the methods and systems for simplifying an electronic design for verification by domain reduction will be provided below with reference to FIGS. 1-6.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-6.

FIG. 1 illustrates a high level schematic block diagrams for simplifying an electronic design for verification by domain reduction in one or more embodiments. More specifically, FIG. 1 illustrates an illustrative high level schematic block diagrams for simplifying an electronic design for verification by domain reduction and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of domain reduction mechanisms 152 including hardware mechanisms and software modules or combinations of one or more hardware mechanisms and one or more software modules that may comprises a data flow extraction mechanism 102 that extract data flows from the specification or description of at least a portion of the electronic design under verification or from the properties to prove or disprove for at least a portion of the electronic design under verification. The set of domain reduction mechanisms 152 may also include a design unrolling mechanism 106 to unroll a combinational logic into sequential logic by, for example, arranging or describing the data flow for each clock cycle of a plurality of clock cycles in accordance with the clock cycles of at least a portion of an electronic design under verification.

The set of domain reduction mechanisms 152 may further optionally include a comparison graph construction mechanism 112 to generate a comparison graph for at least a portion of an electronic design under verification by using unique signals in the at least the portion of the electronic design under verification as vertices and edges interconnecting two vertices whose corresponding signals are directly or indirectly compared. In addition or in the alternative, the set of domain reduction mechanisms 152 may include a graph coloring mechanism 104 to color the vertices of a comparison graph with a number of colors while satisfying the extracted data flows, a relation inference mechanism 108 to infer one or more implied relations between a plurality of vertices of a comparison graph although these plurality of vertices are not directly or indirectly compared according to the extracted data flows, and/or a tokenization mechanism 112 to determine a token of multiple bits that may be used to verify at least a portion of an electronic design under verification, rather than using the real signals for such verification. One or more of these mechanisms in the set of domain reduction mechanisms 152 may be implemented to include or function in tandem with one or more microprocessors each having one or more processor cores of a general purpose computer and corresponding electrical circuitry (e.g., one or more buses and corresponding circuitry) to perform their intended functions.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more mechanisms in the set of domain reduction mechanisms 152. One or more mechanisms in the set 152 may include or at least function in tandem with a microprocessor 192 via a computer bus 194 in some embodiments. In these embodiments, a single microprocessor 192 may be included in and thus shared among more than one mechanism even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
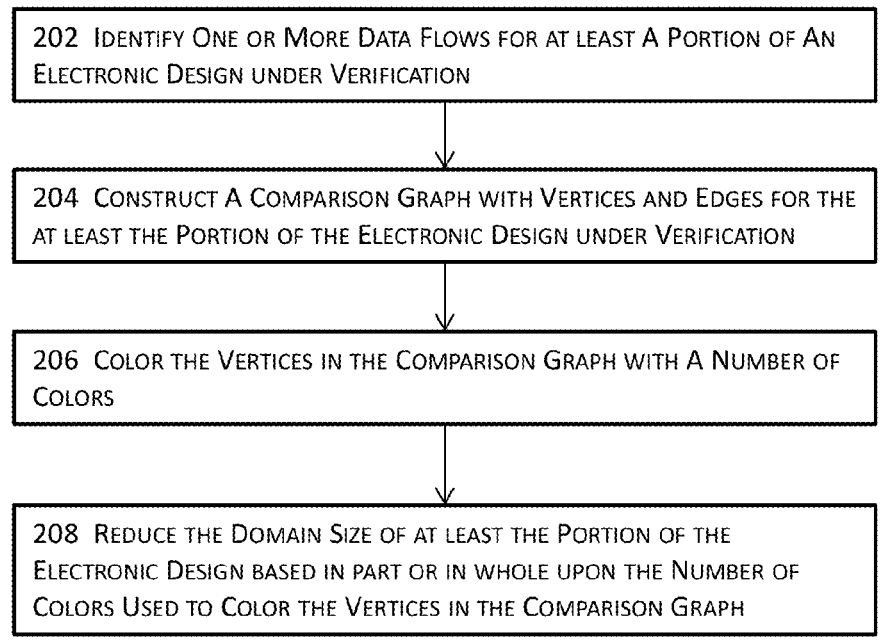
FIG. 2 illustrates a high level block diagram for simplifying an electronic design for verification by domain reduction in one or more embodiments.

FIG. 2 illustrates a high level block diagram for simplifying an electronic design for verification by domain reduction in one or more embodiments. In these one or more embodiments, one or more data flows may be extracted at 202 for at least a portion of an electronic design under verification. In some of these embodiments, the one or more data flows may be extracted by identifying one or more comparators in the portion of the electronic design under verification, traversing backward from the input pins of each of the comparators until the traversal encounters circuit elements other than input signals, flops, or constants or until the traversal encounters circuit elements that transform, rather than simply transmitting or not transmitting (e.g., a multiplexer) signals, and identifying data flows during the traversal.

In some other embodiments, data flows may be extracted by reading, parsing, and/or interpreting design specification or description (e.g., an RTL or register transfer level design description) to extract the data flows. For example, some techniques described herein may read and interpret an RTL description of a portion of an electronic design and extract the data flows as illustrated in FIG. 5A. In this example, an extraction mechanism (e.g., the data flow extraction mechanism 102 in FIG. 1) may be used to parse an RTL description of a portion to identify three distinct signals a, b, and c and the pertinent clock cycles. Based on the circuit description and the clock cycles, the extraction mechanism may extract, for example, the following data flows 500A as listed in FIG. 5A.

a=b for clock cycle #1;
a≠b & a=c for clock cycle #2;
a≠b & a≠c & a=d for clock cycle #3, where a, b, and c denote distinct signals in the portion of the electronic design.

A data flow may include one or more inputs signals, flops, and/or constants that are connected by one or more multiplexers as well as one or more outputs of one or more comparators in a portion of an electronic design in some embodiments. In some embodiments where a portion of the electronic design may include complex logic or other circuit elements that transform a signal value rather than simply transmitting or not transmitting a signal, such complex logic circuit components may be carved out of the portion for the purpose of data flow extraction and may be forwarded to more rigorous verification engines such as a formal verification engine to perform the verification by utilizing, for example, reverse connectivity or other formal verification techniques to verify the complex logic circuit components.

Figure 4A:
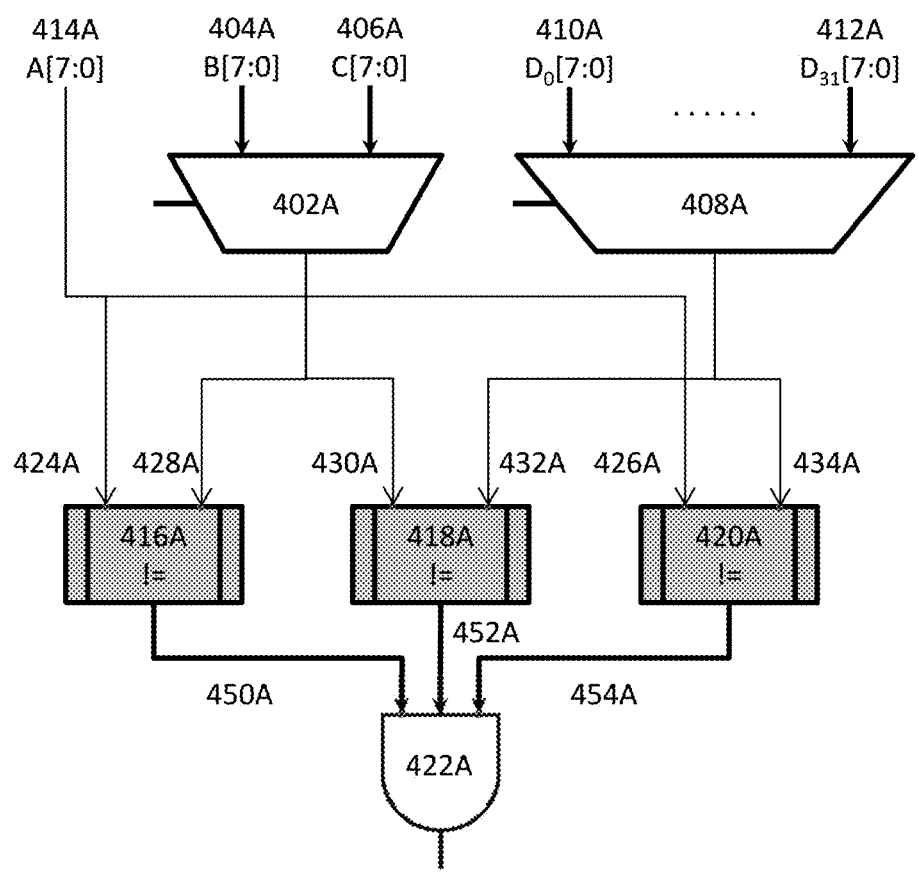
FIG. 4A illustrates a simplified schematic representation of a portion of an electronic design to which some techniques described herein apply in one or more embodiments.
Figures 1, 4B:
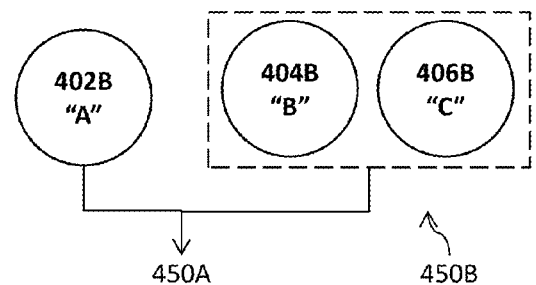
Figures 2, 4B:
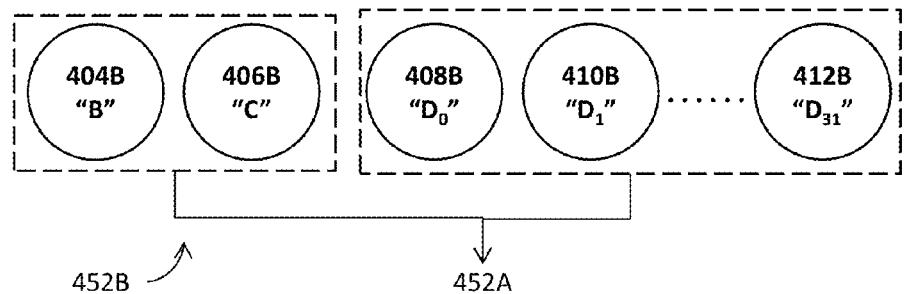
Figures 3, 4B:
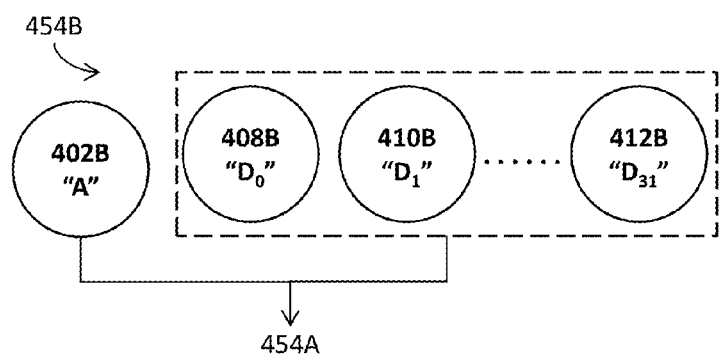
Figures 1, 4C:
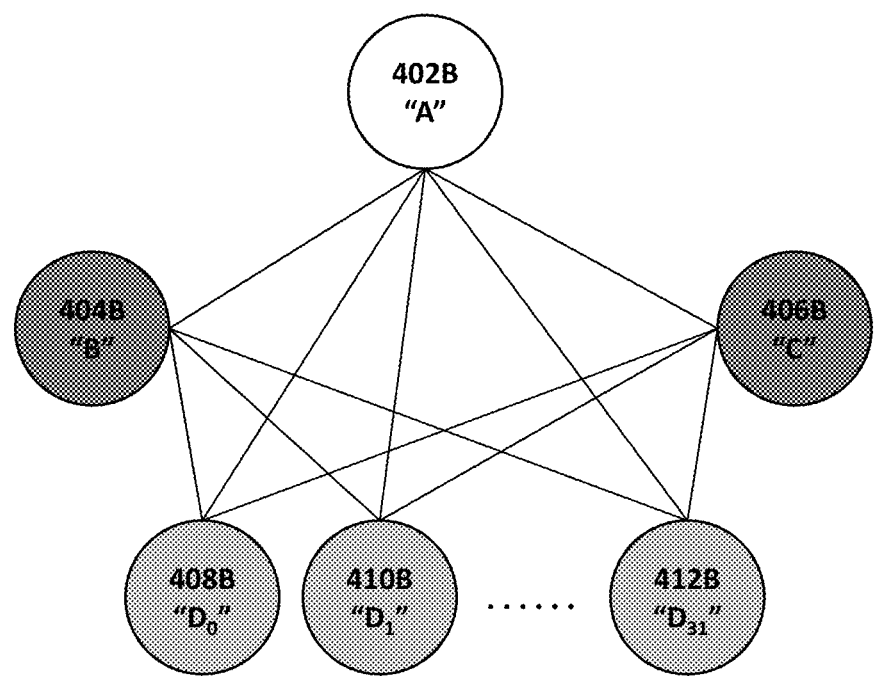
Figures 2, 4C:
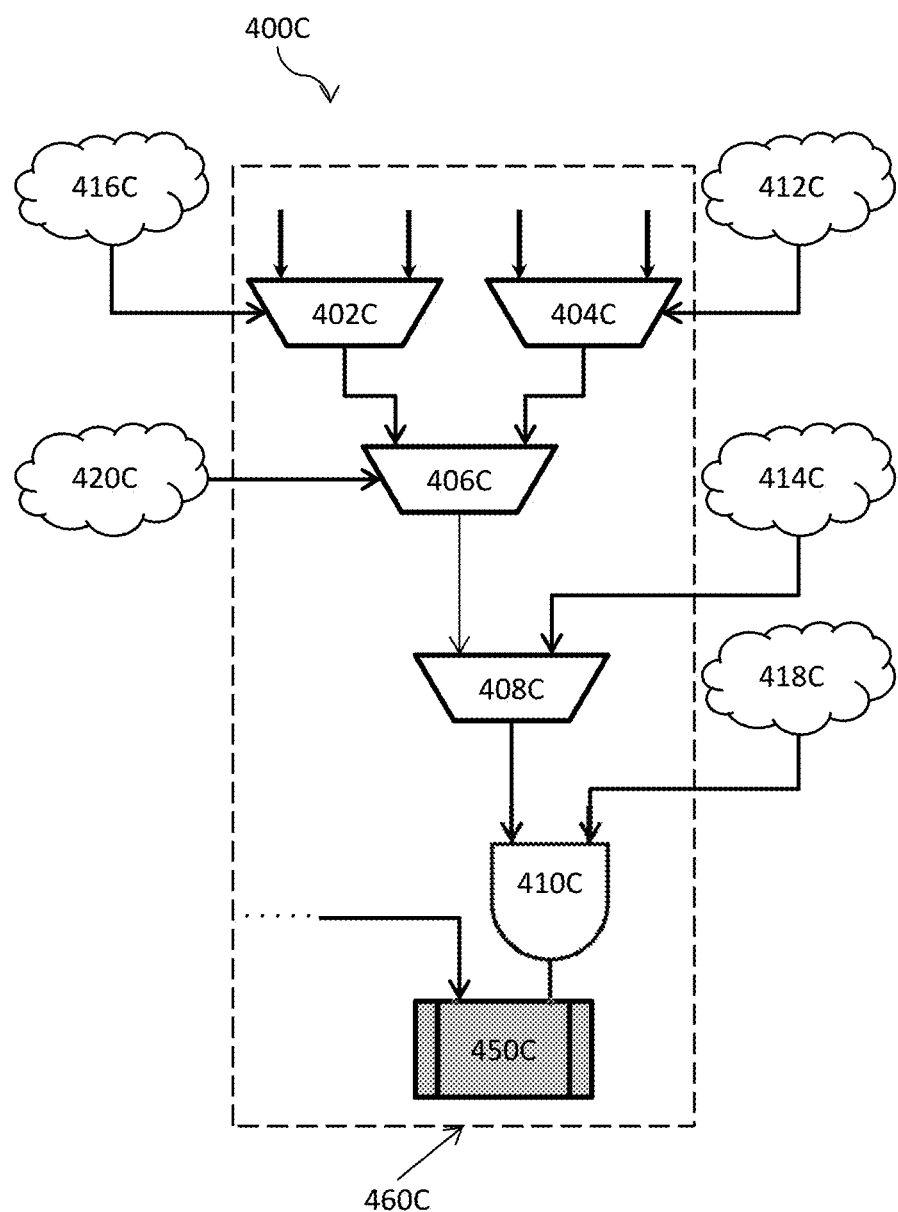

An example of carving out complex logic circuit components is illustrated in FIG. 4C-2 which illustrates a simplified schematic representation of another portion of an electronic design to which some techniques described herein apply in one or more embodiments. In FIG. 4C-2, the simplified schematic representation of a portion of an electronic design 400C includes a plurality of multiplexers (402C, 404C, 406C, and 408C), an OR gate 410C, a comparator 450C, and a plurality of complex logic circuit component blocks (412C, 414C, 416C, 418C, and 420C). The techniques described herein identify the multiplexers, the inputs, and the comparator output as the portion of electronic design of interest 460C and extract the data flows from this portion of electronic design of interest 460C while carving out the complex logic circuit component blocks 412C, 414F, 416C, 418C, and 420C. These complex logic circuit component blocks 412C, 414F, 416C, 418C, and 420C may be verified with, for example, a formal verification engine.

At 204, a comparison graph may be constructed with a plurality of vertices and edges interconnecting at least some of the plurality of vertices for the at least the portion of the electronic design under verification in some embodiments. Distinct signals may be used as vertices in a comparison graph. An edge may be added to a comparison graph to connect two distinct signals that are directly or indirectly compared according to the extracted data flows. Therefore, not all pairs of vertices in a comparison are connected by edges because not all distinct signals are directly or indirectly compared. Two distinct signals are directly compared when one or more data flows include the two distinct signals as the comparands. For example, distinct signals a and b are directly compared as provided by the data flow "a=b" or "a≠b". Two distinct signals are indirectly compared when signals a and b are in the respective transitive fanin cones of signals c and d, and signals c and d are directly compared as provided by a data flow (e.g., "c=d" or "c≠d") in some embodiments. Two distinct signals a and b are indirectly compared when the comparison between a and b may be implied by the aforementioned direct comparisons and/or indirect comparisons. More details about implied comparisons or implied relations between two signals will be provided below with reference to FIGS. 3A-F and 5E-I.

A simplified example of a comparison graph is illustrated in FIG. 5B. More specifically, FIG. 5B illustrates an example of a comparison graph generated according to the examples of data flows illustrated in FIG. 5A. In this example, the portion of the electronic design under verification includes four distinct signals—a, b, c, and d. These four distinct signals may be used as the vertices of the comparison graph illustrated in FIG. 5B. Therefore, the comparison graph now includes four vertices—502A representing signal a; 504A representing signal b; 506A representing signal c; and 508A representing signal d.

Edge 520A represents the equality comparison a=b during the first clock cycle; edge 522A represents the inequality comparison (a≠b) during the second clock cycle; edge 524A represents the inequality comparison (a≠c) during the third clock cycle; edge 526A represents the equality comparison (a=c) during the second clock cycle; and edge 528A represents the equality comparison (a=d) during the third clock cycle. FIG. 5B further illustrates the use of different graphical emphasis for different edges to distinguish the types of comparison during verification or the types of comparators in the portion of the electronic design. In this example, a dashed linetype is used to indicate equality comparisons (e.g., "a=b" of 520A, "a=c" of 526A, and "a=d" of 528A), whereas a solid linetype is used to indicate inequality comparisons (e.g., "a≠b" of 522A and "a≠d" of 524A).

At 206, the comparison graph constructed at 204 may be colored with a number of colors where two vertices involved an equality comparison (e.g., "a=b") are colored with the same color, and two vertices involved in an inequality comparison (e.g., "a≠b") are colored with different colors. A comparison graph may thus be deemed colorable when the comparison graph can be colored with a number of colors that satisfies the extracted data flows in some embodiments. It shall be noted that not all comparison graphs are colorable. For example, a comparison graph having one or more conflict cycles may not be colorable due to the existence of these one or more conflict cycles.

A conflict cycle includes one or more clock cycles for which one or more comparison sub-graphs or corresponding data flows including one inequality comparison (or inequality edge) and/or one or more equality comparisons (or equality edges) in some embodiments. For example, if the data flows indicate "a=b" and ""a≠b" during a clock cycle, this clock cycle may be determined to be a conflict cycle because no data values may concurrently satisfy both "a=b" and ""a≠b" during the clock cycle. On the other hand, a comparison graph representing "a≠b & "b≠c & "c=a" is colorable. In this example, distinct signals a and c may be colored with the first color, and distinct signal b may be colored with the second color. The colored comparison graph will automatically satisfy the data flows "a≠b & "b≠c & "c=a". Another example of colorable comparison graphs may include a comparison graph representing "a≠b & "b≠c & "c≠d & d=a" where distinct signals a and d may be colored with the first color, distinct signal b may be colored with the second color, and distinct signal c may be colored with the third color.

Other comparison graphs including, for example, comparison graphs including only non-cycles or only cycles of equality edges (or equality comparisons), comparison graphs including one or more cycles each having two or more inequality edges (or inequality comparisons), etc. In some embodiments where the comparison graph includes one or more conflict cycles, various techniques may be applied first to resolve these one or more conflict cycles before coloring the comparison graph. For example, techniques including the range allocation techniques or other similar or suitable techniques may be first applied to reduce the original comparison graph into a colorable comparison graph to which coloring may be applied.

In some of these embodiments, range allocation techniques assign a range (e.g., a set of values) to a plurality of vertices connecting one or more edges in a comparison graph so that for an edge connecting a first vertex and a second vertex, a first value selected from the first range assigned to the first vertex and a second value selected from the second range assigned to the second vertex represent the polarity of the edge (e.g., whether the edge is an equality edge or an inequality edge). In some embodiments, range allocation techniques assign minimal ranges to a plurality of vertices of a comparison graph. In some embodiments, the minimum number of colors may be determined to color a colorable comparison graph.

With the determined number of colors to color the comparison graph, the domain size of at least the portion of the electronic design under verification may be reduced at 208 based in part or in whole upon the number of colors for coloring the constructed comparison graph. More details about domain size reduction will be provided in the description below with reference to FIGS. 3A-F and 5A-I.

Figure 3A:
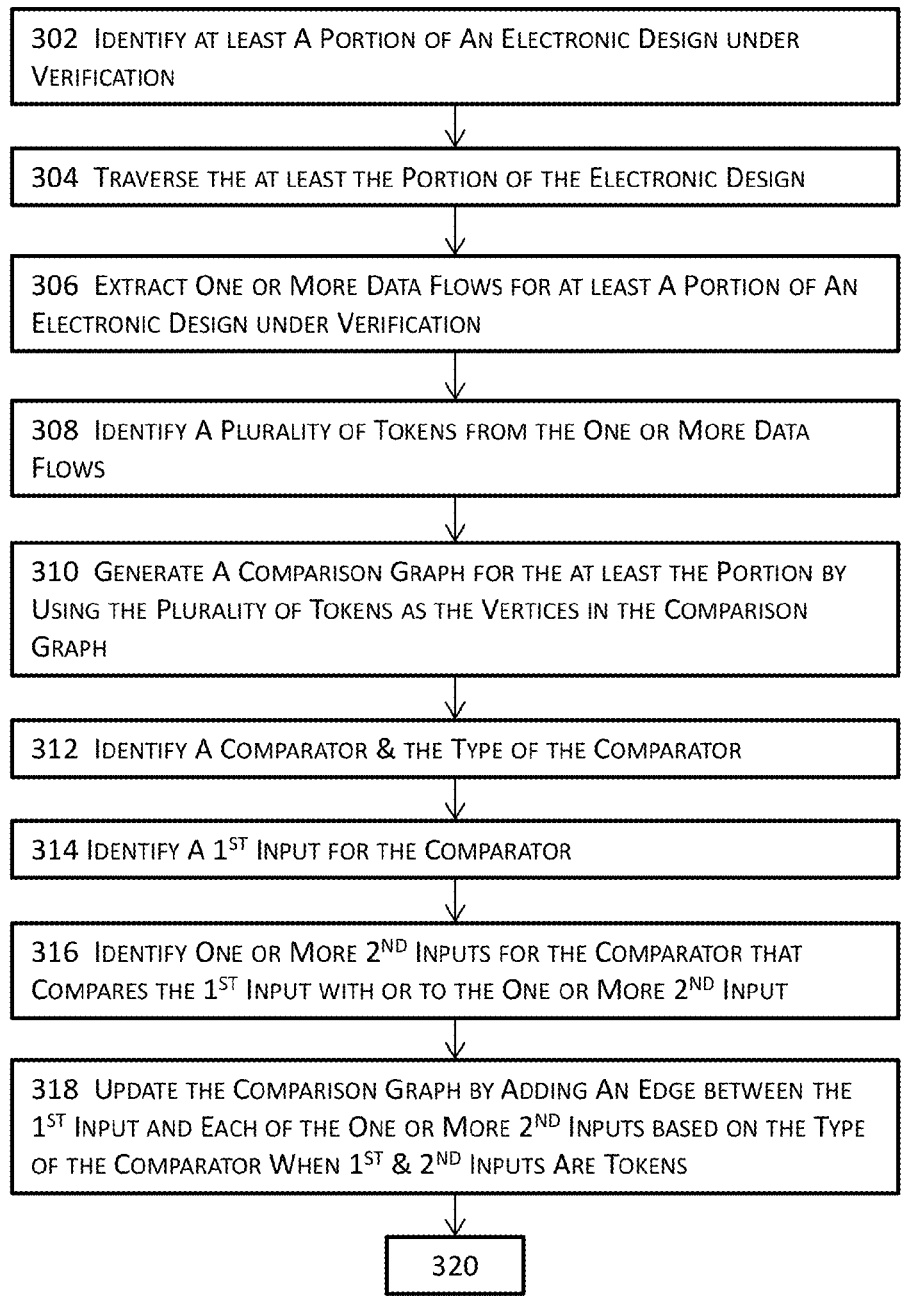
FIGS. 3A-C jointly illustrate a more detailed block diagram for simplifying an electronic design for verification by domain reduction in one or more embodiments.
Figure 3B:
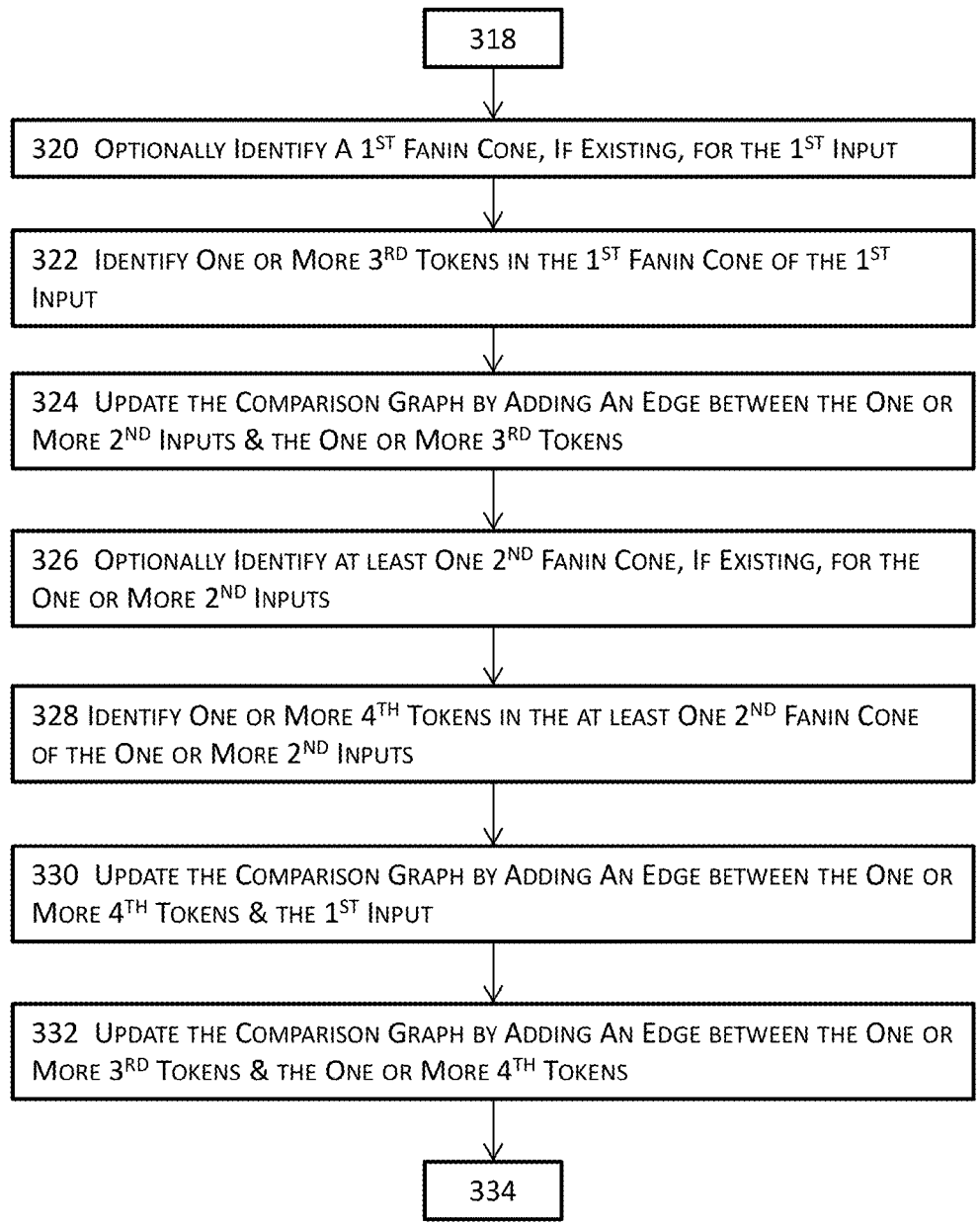
Figure 3C:
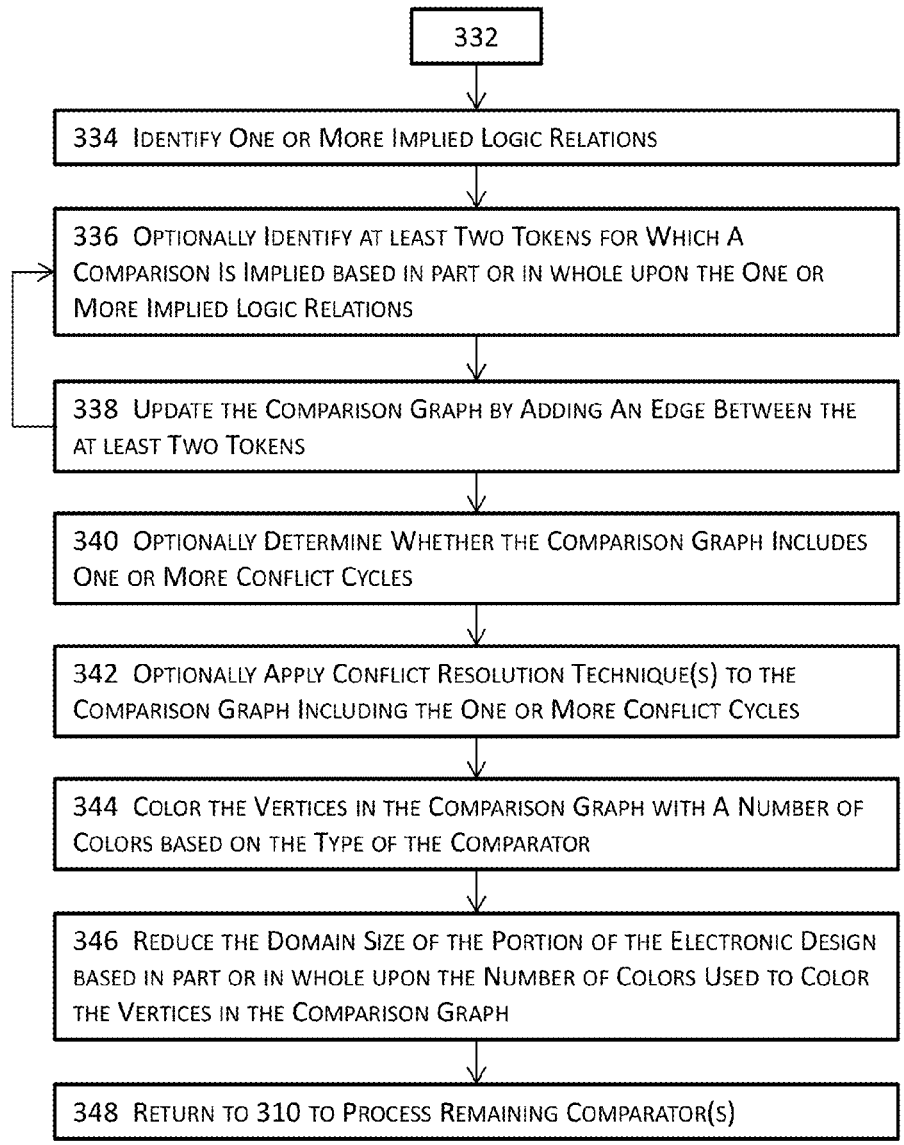

FIGS. 3A-C jointly illustrate a more detailed block diagram for simplifying an electronic design for verification by domain reduction in one or more embodiments. At least a portion of an electronic design under verification may be identified at 302. The portion of an electronic design identified may include one or more inputs signals, flops, and/or constants that are connected by one or more multiplexers as well as one or more outputs of one or more comparators in some embodiments. The portion identified may further include any other types of electronic design components that propagate signals without transforming the signals into one or more other forms or values.

In some embodiments, the at least the portion of the electronic design may be identified from, for example, a schematic design of the electronic design, an RTL design abstraction of the electronic design, or any other suitable representations or abstractions of the electronic design. In some embodiments where a portion of the electronic design may include complex logic or other circuit elements that transform a signal value rather than simply transmitting or not transmitting a signal, such complex logic circuit components may be carved out of the portion for the purpose of data flow extraction and may be forwarded to more rigorous verification engines such as a formal verification engine to perform the verification by utilizing, for example, reverse connectivity or other formal verification techniques to verify the complex logic circuit components.

At 304, the identified portion of the electronic design may be traversed. In some of these embodiments, the identified portion of the electronic design may be traversed backward from, for example, one or more comparators or one or more outputs of the identified portion by using connectivity information which provides how circuit components are interconnected. One or more data flows for the identified portion of the electronic design may be identified at 306 during the traversal. For example, various techniques described herein may identify an output of the identified portion and traverse the identified portion backward to identify various input signals that may be referenced to generate the output.

At 308, a plurality of tokens may be identified from the one or more data flows extracted at 306. A token includes a distinct input signal in the identified portion of electronic design and may be represented by a set of numbers in some embodiments. For example, a token may be represented as a multi-bit value. Two tokens represent two distinct signals and may be represented by the same set of numbers when these two tokens are not involved in an inequality comparison (e.g., a≠b). A comparison graph may then be generated at 310 for the at least the portion of the electronic design under verification by using the plurality of tokens identified at 308 as the vertices in some embodiments. The plurality of vertices for a comparison graph may be arranged in any manner so long as the eventually constructed comparison graph accurately reflects the extracted data flows for the portion of the electronic design represented by the comparison graph.

With the plurality of tokens identified at 308 and inserted into the comparison graph at 310, a comparator or an output signal may be identified at 312 for the at least the portion of the electronic design under verification. In some embodiments where a comparator is identified at 312, the type of the comparator (e.g., an equality comparator, an inequality comparator, etc.) may also be identified at 312. A first input to the comparator or the output signal identified at 312 may be identified at 314. With respect to the first input, one or more second inputs to the same comparator or the identified output signal may be identified at 316, wherein the comparator is to directly compare the first input to or with the one or more second inputs. By directly comparing a first input with or to a second input, the comparator receives both the first and second inputs and determines whether or not the first input is equal to the second input.

With the one or more second inputs identified at 316, the comparison graph constructed at 310 may be updated by adding an edge between the first input and each of the one or more second inputs at 318 when both the first input and the one or more second inputs are tokens (e.g., distinct input signals). In some of these embodiments, an equality edge representing an equality comparison (e.g., "a=b") between two tokens connected with the equality edge and an inequality edge representing an inequality comparison or negative comparison (e.g., "a≠b") between two tokens connected with the inequality edge may be distinguished with graphical emphasis.

In the example illustrated in FIG. FIG. 5B, equality edges are represented in dashed lines, and inequality edges are represented in solid lines although other graphic emphasis may also be used to distinguish these two types of edges in comparison graphs. A first fanin cone, if existing, may also be optionally identified at 320 for the first input by, for example, traversing the portion of the electronic design backward from the first input to identify one or more tokens or distinct input signals leading to the first input. In these embodiments, the first input may not be represented as a token in the comparison graph. Rather, the first input may be a result of the operations of some combinational logic and/or sequential logic.

In the example illustrated in FIG. 4A where the signal 428A is identified as the first input for the inequality comparator 416A, and signal 424A is identified as the signal to be compared with the first token by the inequality comparator 416A, the fanin cone for the signal 428A may be identified by traversing a portion of the electronic design backward to identify the multiplexer 402A having two inputs. One or more third tokens in the first fanin cone of the first input may be identified at 322. In the aforementioned example, two 8-bit tokens 404A (B[7:0]) and 406A (C[7:0]) may be identified as the one or more third tokens at 322. At 324, the comparison graph may be further updated by adding an edge between each of the one or more second inputs (if the one or more second inputs are represented as tokens in the comparison graph) and each of the one or more third tokens identified at 322. In the aforementioned example, these two additional edges are represented as two solid lines connecting 402B and 404B as well as 402B and 406B.

At 326, at least one fanin cone, if existing, may be identified for the one or more second inputs in an identical or substantially similar manner as that described for 320. In some of these embodiments, the one or more second inputs are not represented as one or more tokens in the comparison graph constructed at 310. One or more fourth tokens may be identified at 328 for the at least one second fanin cone for the one or more second inputs, and the comparison graph may also be similarly updated at 330 by adding an edge between each of the one or more fourth tokens and the first input that is also represented as a token in the comparison graph.

The comparison graph may also be optionally updated at 332 by adding an edge between each of the one or more third tokens and each of the one or more fourth tokens in some embodiments. In some of these embodiments, none of the first input and the one or more second inputs are considered as tokens or distinct input signals in the comparison graph constructed at 310. Rather, the first input and the one or more second inputs constitute signals propagated or transmitted from their respective sources (e.g., multiplexers, flops, constants, etc.) In these embodiments, the one or more corresponding tokens or distinct inputs are identified for constructing the comparison graph. One or more implied logic relations between two or more tokens in the comparison graph may be identified at 334.

In some embodiments, these two or more tokens are not directly or indirectly compared during one or more clock cycles or in a comparison graph. For example, for the data flows "A1=A2 & A2≠A3 & A3=A4", an implied relation "A1≠A4" may be determined although tokens A1 and A4 are not directly or indirectly compared. With this implied relation determined, the comparison graph may be further updated by adding an edge to reflect the implied relation. In the aforementioned example, an edge may be added to reflect the inequality between token A1 and token A4 even though tokens A1 and A4 are not directly or indirectly compared. In some embodiments, an artificial path may be identified from the comparison graph to aid the determination of one or more implied relations from a comparison graph that is being constructed. It shall be noted that the path described herein refers to a collection of edges in a comparison graph or in a plurality of unrolled comparison sub-graphs corresponding to a plurality of clock cycles in some embodiments. This collection of edges allows traversal from one token to another token through each edge in the collection of edges once in some of these embodiments.

Figure 5D:
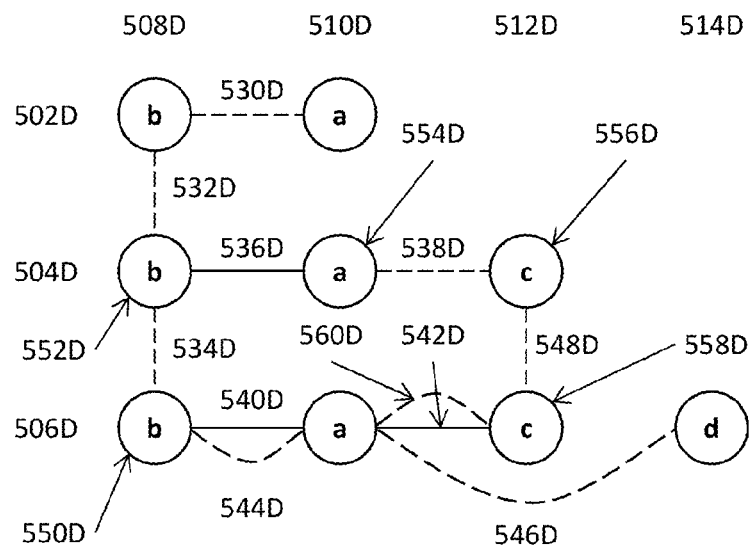
FIG. 5D illustrates an example of constructing a comparison graph by unrolling the simplified electronic design and collapsing sub-graphs in multiple clock cycles for the data flow examples illustrated in FIG. 5A in one or more embodiments.
Figure 5E:
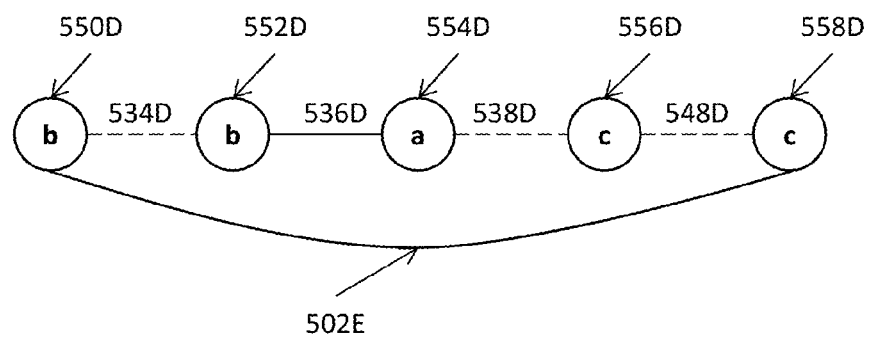
FIG. 5E illustrates an example of adding an implied relation between two nodes in for the comparison graph illustrated in FIG. 5D in one or more embodiments.

In some embodiments where the comparison graph is constructed by unrolling the portion of the electronic design of interest over a plurality of clock cycles, the collection of edges need not belong to a single clock cycle. Rather, the collection of edges may belong to more than one clock cycle. In the example illustrated in FIGS. 5D-E, FIG. 5D illustrates unrolling a portion of an electronic design provided in FIG. 5A. A path may be identified to traverse in a clockwise direction from token 550D through edge 534D (an equality edge) to token 552D, through edge 536D (an inequality edge) to token 554D, through edge 538D to token 556D, and through edge 548D to token 558D ("c").

In this example, it is assumed for the sole purpose of the ease of explanations and illustration that each of circuit components for input signals "b", "c", and "d" constitutes a simple flop 502C whose output is equal to its input as illustrated in FIG. 5C. With these simple flops "b", "c", and "d", edges 532D and 534D (indicating "b=b") and 548D (indicating "c=c") may be added between the unrolled comparison sub-graphs for clock cycles 502D, 504D, and 506D. In this example, the path 502E spans across clock cycle 505D and clock cycle 504D. It shall be noted that the traversal along a path needs not be in the clockwise direction so long as each edge in the collection of edges for the path is traversed once.

In FIG. 5D, the first row corresponds to the first clock cycle 502D; the second row corresponds to the second clock cycle 504D; and the first row corresponds to the third clock cycle 506D. The columns 508D, 510D, 512D, and 514D indicate tokens for comparisons. For example, in the first clock cycle 502D, the first data flow indicates "a=b", and the unrolled comparison sub-graph for the first clock cycle thus includes an equality edge 530D between columns 508D and 510D. The second data flow indicates "a≠b & a=c", and the unrolled comparison sub-graph for the second clock cycle 504D thus includes an inequality edge 536D between columns 508D and 510D or tokens 552D and 554D and an equality edge 538D between columns 510D and 512D or between tokens 554D and 556D.

The third data flow indicates "a≠b & a≠c &a≠d", and the unrolled comparison sub-graph for the second clock cycle 506D thus includes an inequality edge 540D between columns 508D and 510D, an inequality edge 542D between columns 510D and 512D, and an equality edge 546D between columns 510D and 514D. FIG. 5D further illustrates the processing of collapsing the comparison sub-graphs by adding the edges from the sub-graphs corresponding to the first clock cycle 502D and the second clock cycle 504D to the sub-graph corresponding to the third clock cycle 506D. As a result of collapsing these sub-graphs, edge 540D (from edge 536D in the second clock cycle 504D) is added between tokens "b" and "a"; edge 560D (from edge 538D in the second clock cycle 504D) is added between tokens "a" and "c". By constructing a comparison graph via unrolling a portion of an electronic design and collapsing a plurality of comparison sub-graphs of a plurality of clock cycles, a comparison sub-graph (e.g., the comparison sub-graph for the third clock cycle 506D in FIG. 5D) may be morphed into the comparison graph for the portion of the electronic design of interest. More details about determining a path and an implied logic relation are described below in the description for FIGS. 3D-F and 5A-I.

At least two tokens for which a comparison is implied by at least one of the one or more implied logic relations may be optionally identified at 336. In some embodiments, these at least two tokens may be identified based in part or in whole upon the ordering of the plurality of tokens in a comparison graph or in one or more comparison sub-graphs for one or more clock cycles. The ordering may be determined in such a way that one or more tokens of the plurality of tokens may be safely removed or represented with the same set of numbers (e.g., a multiple-bit value) without compromising the satisfiability of the extracted data flows or the verification of the at least the portion of the electronic design.

In the example illustrated in FIG. 5E, the ordering for tokens 550D, 552D, 554D, 556D, and 558D may include the ordering of {0, 2, 3, 4, 1}, where a higher numerical value in the ordering indicates a higher priority to remove the associated token or to represent the associated token with a common set of numbers as one or more other tokens. In some embodiments, the two or more tokens identified at 336 may be determined to be the two or more tokens associated with the highest or higher priorities according to the one or more implied logic relations. The comparison graph may then be updated by adding an edge between these two or more tokens according to the one or more implied logic relations at 338.

In the example illustrated in FIG. 5E with the ordering presented immediately above, tokens 550D (associated with the order "0") and 558D (associated with order "1") may be identified as the two or more tokens based in part or in whole upon the implied logic relation at 336; and an edge 502E may be added to the comparison graph. In some other embodiments, two or more tokens may be optionally identified at 336, regardless of the ordering or priority of the tokens in the comparison graph or in one or more comparison sub-graphs. The process may return to 336 to identify one or more additional pairs of tokens and repeat the processing until all tokens identified based in part or in whole upon the one or more identified implied logic relations are similarly processed and the comparison graph updated.

The comparison graph may be optionally checked to determine whether or not the comparison graph includes one or more conflict cycles at 340. As described earlier, a conflict cycle includes one or more clock cycles for which one or more comparison sub-graphs or corresponding data flows including one inequality comparison (or inequality edge) and/or one or more equality comparisons (or equality edges) in some embodiments. The existence of a conflict cycle may cause the comparison graph not to be colorable. If it is determined that the comparison graph includes one or more conflict cycles, conflict resolution techniques may be applied at 342 to resolve these one or more conflict cycles. For example, techniques including the range allocation techniques or other similar or suitable techniques may be first applied to reduce the original comparison graph into a colorable comparison graph to which coloring may be applied. The comparison graph may be colored at 344 with a number of different colors.

In some embodiments, the comparison graph may be colored with a number of colors where two vertices (e.g., tokens) involved an equality comparison (e.g., "a=b") are colored with the same color, and two vertices involved in an inequality comparison (e.g., "a≠b") are colored with different colors. A comparison graph may thus be deemed colorable when the comparison graph can be colored with a number of colors while satisfying the extracted data flows or satisfiability in some embodiments. In some embodiments, the minimum number of colors may be determined to color a colorable comparison graph. It shall be noted that coloring a comparison graph does not necessarily require using actual colors or patterns to graphically represent the comparison graph or a portion thereof. Rather, coloring a comparison graph may involve assigning distinct numerical or symbolic values to tokens in a comparison graph in a way that may or may not be visible in a user interface while satisfying the extracted data flows or properties to be proved or disproved for the portion of the electronic design under verification.

The domain size for the portion of the electronic design for which the comparison graph is constructed may thus be reduced at 346 based in part or in whole upon the number of colors used to color the comparison graph. In some embodiments, the domain size of a portion of an electronic design may include one or more variable widths needed to represent the distinct input signals in the portion of the electronic design and hence the total bit count of distinct input signals in the portion of the electronic design. In the example illustrated in FIGS. 4A-C, the original portion of the electronic design includes thirty-five (35) signals (A, B, C, and $D_0$ through $D_{31}$).

Therefore, each of the signals has 8 bits and thus 256 possible values. With the colored comparison graph illustrated in FIG. 4C-1, only three colors are needed to color the tokens in the comparison graph while satisfying the extracted data flows. Because three values can be uniquely represented by a 2-bit variable having possible values of 0 ("00" in binary, 1 ("01" in binary, 2 ("10" in binary), and 3 ("11" in binary). Therefore, the required variable width for verification of the portion of the electronic design is reduced from the original 8-bit to 2-bit. That is, the original portion of the electronic design has 256 possible values in the original 8-bit variables, yet only 2 bits are needed to encode the three colors used to color the comparison graph.

In addition, the original portion of the electronic design includes 35 input signals, each having an 8-bit width. Therefore, the original portion of the electronic design has the total bit count of 280 (8×35). The comparison graph may be colored with three different colors that may be encoded with 2 bits while satisfying the extracted data flows. Therefore, the total bit count for the comparison graph is only 70 (35×2). The comparison graph with the colored tokens may be used to verify the portion of the electronic design by using the reduced variable width tokens, rather than the original 8-bit signals, to provide the advantage of considerable savings and conservation in the computation cycles and/or the memory footprint required for successful verification of the portion of the electronic design. At 348, the process may return to 310 to process the remaining comparators in the portion of the electronic design under verification and repeat at least some of the acts 310 through 346 in identical or substantially similar manners.

Figure 3D:
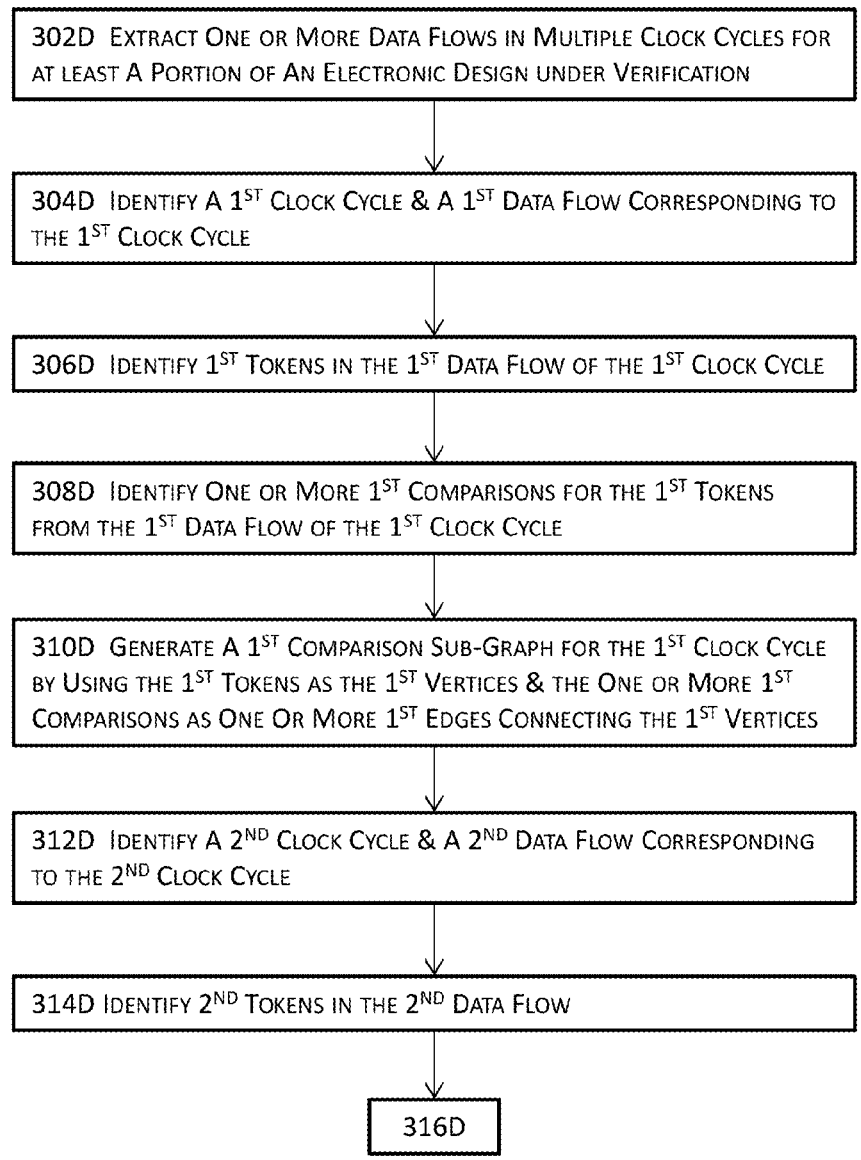
FIGS. 3D-F jointly illustrate another more detailed block diagram for simplifying an electronic design for verification by domain reduction in one or more embodiments.
Figure 3E:
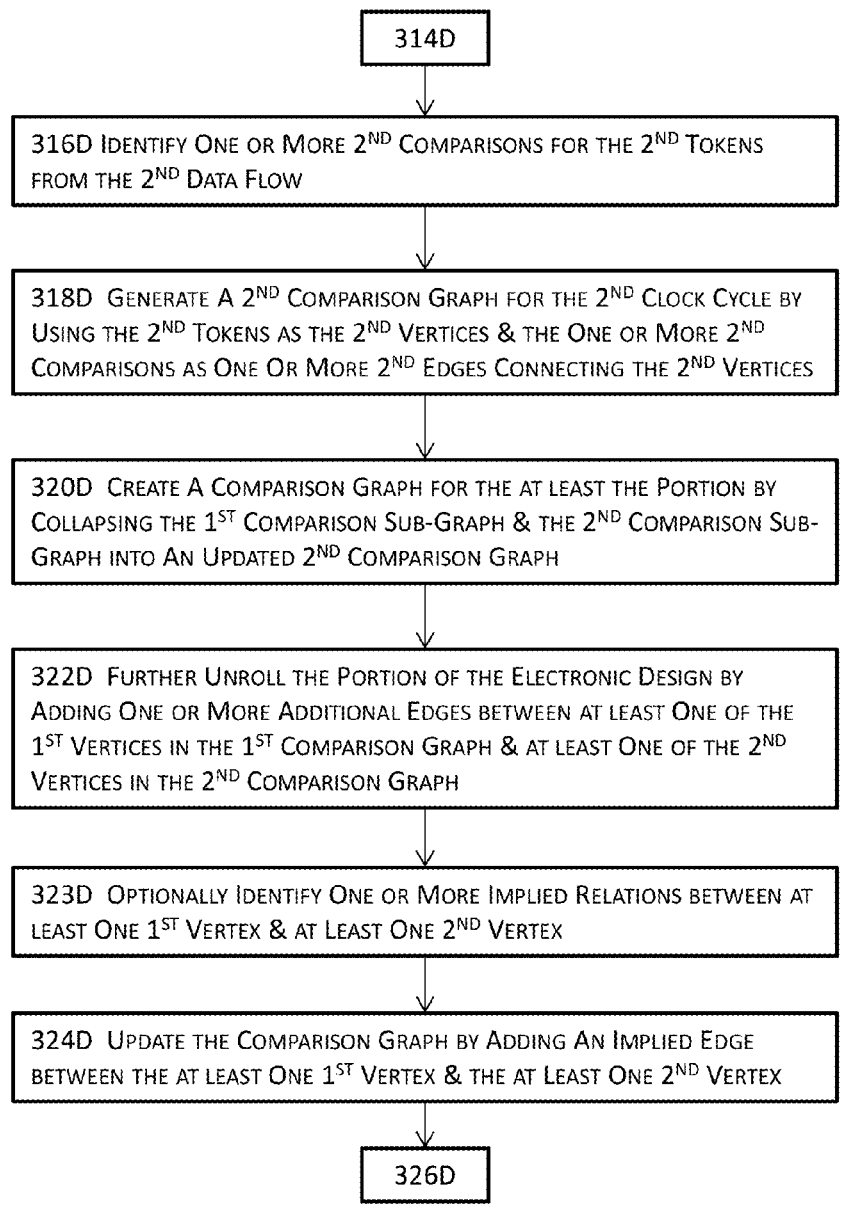
Figure 3F:
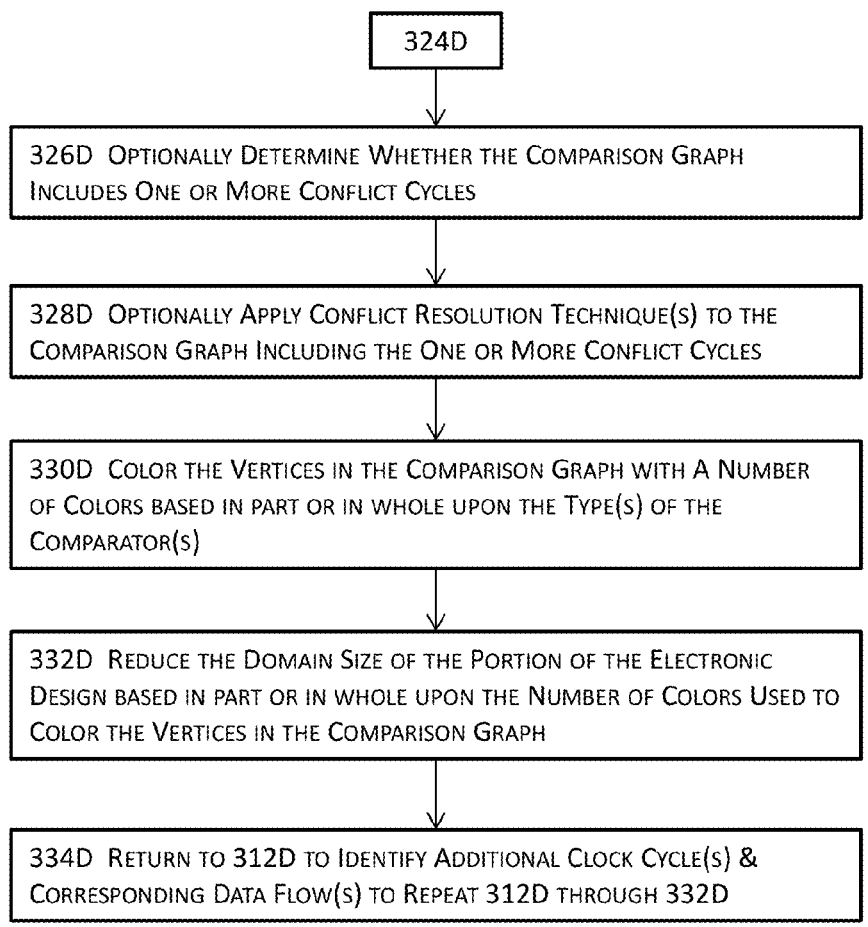

FIGS. 3D-F jointly illustrate another more detailed block diagram for simplifying an electronic design for verification by domain reduction in one or more embodiments. In these one or more embodiments, one or more data flows for multiple clock cycles may be extracted at 302D for at least a portion of an electronic design under verification. In some embodiments, data flows may be extracted by reading, parsing, and/or interpreting design specification or description (e.g., an RTL or register transfer level design description) to extract the data flows. For example, some techniques described herein may read and interpret an RTL description of a portion of an electronic design and extract the data flows as illustrated in FIG. 5A. In this example, an extraction mechanism (e.g., the data flow extraction mechanism 102 in FIG. 1) may be used to parse an RTL description of a portion to identify three distinct signals a, b, and c and the pertinent clock cycles. Based on the circuit description and the clock cycles, the extraction mechanism may extract, for example, the following data flows 500A as listed in FIG. 5A.

a=b for clock cycle #1;

a≠b & a=c for clock cycle #2;

a≠b & a≠c & a=d for clock cycle #3, where a, b, and c denote distinct signals in the portion of the electronic design.

FIG. 5B illustrates an example of a comparison graph for those examples of data flows illustrated in FIG. 5A in one or more embodiments. More specifically, FIG. 5B shows a simplified example of a comparison graph having the tokens or distinct input signals ("a", "b", and "c" in the extracted data flows) as well as equality edges and inequality edges connecting the tokens or distinct input signals according to the extracted data flows. In FIG. 5B, an equality edge representing an equality comparison (e.g., edge 520A between tokens 502A and 504A, edge 526A between tokens 502A and 506A, or edge 528A between tokens 502A and 508A) is represented with a dashed linetype, and an inequality edge representing an inequality comparison (e.g., edge 522A between tokens 502A and 504A or edge 524A between tokens 502A and 506A) is represented with a solid linetype to graphically distinguish from the equality edges representing equality comparisons. FIG. 5C illustrates a simple flop 502C whose output (at the Q pin of the flop) is equal to its input (at the D pin of the flop). In this example illustrated in FIGS. 5A-I, it is assumed that electronic circuit components of the distinct input signals "b", "c", and "d" all constitute such a simple flop for the sole purpose of the ease of illustration and explanation.

The first clock cycle and the data flow corresponding to the first clock cycle may be identified at 304D. For example, a design or data flow extraction mechanism may read, parse, and/or interpret the design specification or description (e.g., an RTL or register transfer level design description) of the portion of the electronic design to extract the first data flow for the first clock cycle at 304D. One or more first tokens or distinct input signals in the first data flow for the first clock cycle may be identified at 306D. In the aforementioned example where data flow "a=b" is extracted for the first clock cycle, two tokens "a" and "b" may be identified at 306D because each of them represents a distinct input signal. One or more first comparisons for the one or more first tokens may be identified at 308D from the first data flow of the first clock cycle.

In the aforementioned example, the equality comparison in the first data flow "a=b" may be identified at 308D as the first comparison. A first comparison graph or sub-graph for the first clock cycle may be generated at 310D by using the one or more first tokens identified at 306D as the one or more vertices in the first comparison sub-graph and adding one or more edges between the corresponding one or more first tokens according to the first comparison identified at 308D. In the example illustrated in FIG. 5D, 502D represents the first clock cycle. As FIG. 5D shows, the first comparison sub-graph includes two vertices "b" and "a". An edge 530D having a dashed line type representing an equality comparison is added to the first comparison sub-graph for the first clock cycle 502D to indicate the equality comparison ("a=b") according to the first data flow.

At 312D, a second clock cycle and a second data flow corresponding to the second clock cycle may be identified. In the aforementioned example, the second data flow "a≠b & a=c" may be identified by, for example, using an extraction mechanism to read, parse, and/or interpret the design specification or description (e.g., an RTL or register transfer level design description) of the portion of the electronic design to extract the second data flow for the second clock cycle at 312D. Similar to the processing for the first clock cycle, one or more second tokens are identified at 314D for the second data flow. In the above example, the unique input signals "a", "b", and "c" may be identified at 314D as the one or more second tokens.

One or more second comparisons or one or more types thereof may be identified at 316D from the second data flow for the one or more second tokens. In the aforementioned example, an equality comparison may be identified at 316D between tokens "a" and "c", and an inequality comparison may also be identified at 316D between tokens "a" and "b" from the second data flow. A second comparison sub-graph may be generated for the second clock cycle at 318D by using the one or more second tokens as the one or more vertices in the second comparison sub-graph and adding edges between the second tokens according to the comparisons or the types of comparisons between these second tokens.

In the example illustrated in FIG. 5D, 504D represents the second clock cycle. As FIG. 5D shows, the second comparison sub-graph includes three vertices "b" 552D, "a" 554D, and "c" 556D. An edge 536D having a solid line type representing an inequality comparison is added to the second comparison sub-graph for the second clock cycle 504D to indicate the inequality comparison ("a≠b"); and another edge 538D having a dashed line type representing an equality comparison is also added to the second comparison sub-graph for the second clock cycle 504D to indicate the equality comparison ("a=c") according to the second data flow. Because the electronic circuit component for token "b" is assumed to be a simple flop for the sole purpose of the ease of illustration and explanation, an edge 532D may also be added to connect tokens "b" in the first and the second comparison sub-graphs.

FIG. 5D further illustrates the third clock cycle 506D and the corresponding third comparison sub-graph. As FIG. 5D shows, the third comparison sub-graph includes four vertices "b" (550D), "a", "c" (558D), and "d"—the four tokens in the third data flow a≠b & a≠c & a=d. An edge 540D having a solid line type representing an inequality comparison is added to the third comparison sub-graph for the third clock cycle 506D to indicate the inequality comparison ("a≠b") between "a" and "b"; another edge 542D having a solid linetype representing an inequality comparison is added to the third comparison sub-graph for the third clock cycle 506D to indicate the inequality comparison ("a≠c") between "a" and "c"; another edge 546D having a dashed linetype representing an equality comparison is added to the third comparison sub-graph for the third clock cycle 506D to indicate the equality comparison ("a=d") between "a" and "d" according to the third data flow. Because the electronic circuit component for token "b" is assumed to be a simple flop for the sole purpose of the ease of illustration and explanation, an edge 534D may also be added to connect tokens "b" in the second and the third comparison sub-graphs. In addition, because the electronic circuit component for token "c" is also assumed to be a simple flop for the sole purpose of the ease of illustration and explanation, an edge 548D may also be added to connect tokens "c" in the second and the third comparison sub-graphs.

At 320D, a comparison graph may be created for the at least a portion of the electronic design by collapsing the comparison sub-graphs onto the comparison graph for the latest clock cycle. In the above example illustrated in FIG. 5D, the edges in the first and second comparison sub-graphs may be collapsed onto the third comparison sub-graph for the third clock cycle 506D. For example, because of the edge 530D connecting tokens "a" and "b" in the first comparison sub-graph for the first clock cycle 502D, an edge 544D having a dashed linetype may be added between tokens "a" and "b" in the third comparison sub-graph for the third, latest clock cycle 506D.

Also, another edge 542D may also be added between tokens "a" and "c" in the third comparison sub-graph due to the edge 538D between the same tokens "a" and "c" for the second clock cycle 504D. This process of constructing comparison sub-graphs for multiple clock cycles and/or the subsequent collapsing of one or more comparison sub-graphs onto another comparison sub-graph may be deemed as unrolling. It shall be noted that unrolling a portion of an electronic circuit design need not necessarily collapse onto the latest comparison sub-graph. In some embodiments, unrolling may collapse one or more comparison sub-graphs onto another comparison sub-graph having the most number of tokens, and this happens to be the comparison sub-graph for the third clock cycle 506D.

At 322D, unrolling the portion of the electronic design may further optionally include adding one or more additional edges between at least one first vertex of the first comparison sub-graph and at least one second vertex of the second comparison sub-graph (or another comparison sub-graph) based in part or in whole upon the types of electronic design components. Some examples of such additional edges may include edges 532D, 534D, and 548D due to the simple flop architecture for the electronic circuit components for the input signals "b" and "c". At 323D, one or more implied relations may be identified for two or more tokens that are not directly or indirectly compared by any comparators based in part or in whole upon the one or more extracted data flows in the description for reference numeral 334 of FIG. FIG. 3C above. The comparison graph may be updated at 324D by adding one or more implied edges between the two or more tokens according to the one or more implied relations identified at 324D in an identical or substantially similar manner as that described for reference numeral 336 of FIG. 3C.

The comparison graph may be optionally checked to determine whether or not the comparison graph includes one or more conflict cycles at 326D. As described above, a conflict cycle includes one or more clock cycles for which one or more comparison sub-graphs or corresponding data flows including one inequality comparison (or inequality edge) and one or more equality comparisons (or equality edges) in some embodiments. The existence of a conflict cycle may cause the comparison graph to be not colorable. If it is determined that the comparison graph includes one or more conflict cycles, conflict resolution techniques may be applied at 328D to resolve these one or more conflict cycles. For example, techniques including the range allocation techniques or other similar or suitable techniques may be first applied to reduce the original comparison graph into a colorable comparison graph to which coloring may be applied. The comparison graph may be colored at 330D with a number of different colors in an identical or substantially similar manner as that described for reference numeral 344 of FIG. 3C.

The domain size for the portion of the electronic design for which the comparison graph is constructed may thus be reduced at 332D based in part or in whole upon the number of colors used to color the comparison graph. In some embodiments, the domain size of a portion of an electronic design may include one or more variable widths needed to represent the distinct input signals in the portion of the electronic design and hence the total bit count of distinct input signals in the portion of the electronic design. The process may return to 334D to process the remaining clock cycles in the portion of the electronic design under verification and repeat at least some of the acts 312D through 332D in identical or substantially similar manners as described above.

FIG. 4A illustrates a simplified schematic representation of a portion of an electronic design to which some techniques described herein apply in one or more embodiments. More specifically, the portion of the electronic design includes distinct input signals A (414A), B (404A), C (406A), and $D_0$ (410A), $D_1$, through $D_{31}$ (412A), each of which has an 8-bit width. Input signal "A" is propagated to an input pin as signal 424A of comparator 416A for inequality comparison with signal 428A as well as to an input pin as signal 426A for comparator 420A for an inequality comparison with signal 434A. Input signals "B" and "C" are input into multiplexer 402A whose output signal is propagated as signal 428A for an inequality comparison with signal 424A by comparator 416A and also as signal 430A for an inequality comparison with 432A by comparator 418A. Input signals "$D_0$", "$D_1$", . . . , "$D_{31}$" are input into multiplexer 408A whose output signal is propagated as signal 432A for an inequality comparison with signal 430A by comparator 418A and also as signal 434A for an inequality comparison with 426A by comparator 420A. The outputs of comparators 416A, 418A, and 420A are propagated to an OR gate 422A.

FIGS. 4B-1 through 4B-3 illustrate some examples of constructing a comparison graph for the portion of the electronic design illustrated in FIG. 4A in one or more embodiments. More specifically, FIG. 4B-1 illustrates an intermediate product 450B of comparison graph construction including the identification of the comparator 416A or the output signal 450A, and the backward traversal to identify the tokens or distinct input signals A (402B), B (404B), and C (406B). FIG. 4B-1 thus shows that token 402B is directly compared to or with token 404B and also directly compared to or with token 406B.

FIG. 4B-2 illustrates another intermediate product 452B of comparison graph construction including the identification of the comparator 418A or its output signal 452A, and the backward traversal to identify the tokens or distinct input signals B (404B) and C (406B) for one of the input pins as well as the tokens or distinct input signals 408B, 410B, 412B of input signals "$D_0$", "$D_1$", . . . , "$D_{31}$". FIG. 4B-2 thus shows that token 404B is directly compared to or with each of the tokens 408B, 410B, and 412B (each of "$D_0$", "$D_1$" . . . "$D_{31}$"), and that token 406B is also directly compared to or with each of the tokens 408B, 410B, and 412B (each of "$D_0$", "$D_1$", . . . , "$D_{31}$").

FIG. 4B-3 illustrates another intermediate product 454B of comparison graph construction including the identification of the comparator 420A or its output signal 454A, and the backward traversal to identify the tokens or distinct input signals A (402B) for one of the input pins as well as the tokens or distinct input signals 408B, 410B, 412B of input signals "$D_0$", "$D_1$", . . . , "$D_{31}$" for the other input pin of the comparator 420A. FIG. 4B-3 thus shows that token 402B is directly compared to or with each of the tokens 408B, 410B, and 412B (each of "$D_0$", "$D_1$" . . . "$D_{31}$").

FIG. 4C-1 illustrates a simplified schematic representation of another portion of an electronic design to which some techniques described herein apply in one or more embodiments. With the intermediate products 450B, 452B, and 454B, a comparison graph may be constructed by having the tokens or unique input signals (402B or "A", 404B or "B", 406B or "C", 408B or "$D_0$", 410B or "$D_1$", and 412B or "$D_{31}$") as the vertices. Because each of "A", "B", and "C" is directly compared with the remaining tokens, an edge is added between each of tokens "A", "B", and "C" and the remaining tokens to arrive at the comparison graph illustrated in FIG. 4C-1. In this example illustrated in FIG. 4C-1, all comparisons are inequality comparisons, and all edges thus have the same linetype (solid linetype) although it is not required to distinguish edges based on their corresponding comparison types.

FIG. 5A illustrates some examples of data flows of a portion of a simplified electronic design in one or more embodiments. As described above, data flows may be extracted by reading, parsing, and/or interpreting design specification or description (e.g., an RTL or register transfer level design description) to extract the data flows. For example, some techniques described herein may read and interpret an RTL description of a portion of an electronic design and extract the data flows. In this example, an extraction mechanism (e.g., the data flow extraction mechanism 102 in FIG. 1) may be used to parse an RTL description of a portion to identify three distinct signals a, b, and c and the pertinent clock cycles. Based on the circuit description and the clock cycles, the extraction mechanism may extract, for example, the following data flows 500A as listed in FIG. 5A.

a=b for clock cycle #1;
a≠b & a=c for clock cycle #2;
a≠b & a≠c & a=d for clock cycle #3, where a, b, and c denote distinct signals in the portion of the electronic design.

FIG. 5B illustrates an example of a comparison graph for those examples of data flows illustrated in FIG. 5A in one or more embodiments. In this example, the portion of the electronic design under verification includes four distinct signals—a, b, c, and d. These four distinct signals may be used as the vertices of the comparison graph illustrated in FIG. 5B. Therefore, the comparison graph now includes four vertices—502A representing signal a; 504A representing signal b; 506A representing signal c; and 508A representing signal d. Edge 520A represents the equality comparison a=b during the first clock cycle; edge 522A represents the inequality comparison (a≠b) during the second clock cycle; edge 524A represents the inequality comparison (a≠c) during the third clock cycle; edge 526A represents the equality comparison (a=c) during the second clock cycle; and edge 528A represents the equality comparison (a=d) during the third clock cycle. FIG. 5B further illustrates the use of different graphical emphasis for different edges to distinguish the types of comparison during verification or the types of comparators in the portion of the electronic design. In this example, a dashed linetype is used to indicate equality comparisons (e.g., "a=b" of 520A, "a=c" of 526A, and "a=d" of 528A), whereas a solid linetype is used to indicate inequality comparisons (e.g., "a≠b" of 522A and "a≠d" of 524A).

FIG. 5C illustrates an example of a circuit component for those examples of data flows illustrated in FIG. 5A in one or more embodiments. In this example illustrated in FIG. 5A, it is assumed for the sole purpose of the ease of explanations and illustration that each of circuit components for input signals "b", "c", and "d" constitutes a simple flop 502C whose output is equal to its input as illustrated in FIG. 5C.

Figure 5F:
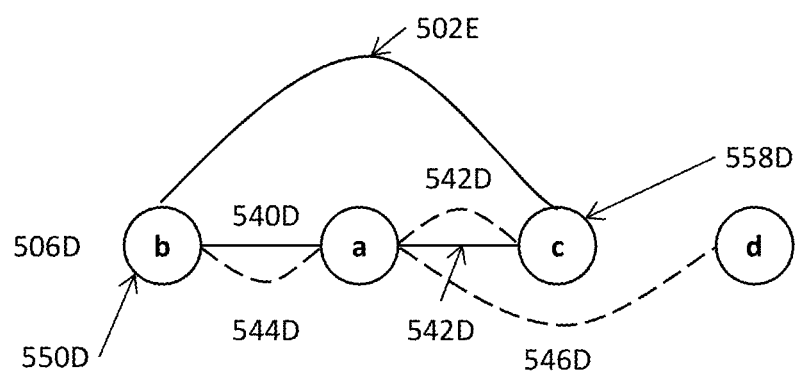
FIG. 5F illustrates an example of a comparison graph for the data flow examples illustrated in FIG. 5A in one or more embodiments.

FIG. 5F illustrates an example of a comparison graph for the data flow examples illustrated in FIG. 5A in one or more embodiments. More specifically, FIG. 5F illustrates one representation of a comparison graph for the portion of the electronic design provided by the extracted data flows illustrated in FIG. 5A. As it may be seen from FIGS. 5D-F, the comparison graph illustrated in FIG. 5F may be derived from collapsing the comparison sub-graphs for the first clock cycle 502D and the second clock cycle 504D onto the comparison sub-graph for the third clock cycle 506D with the addition of the implied edge 502E shown in FIG. 5E.

Figure 5G:
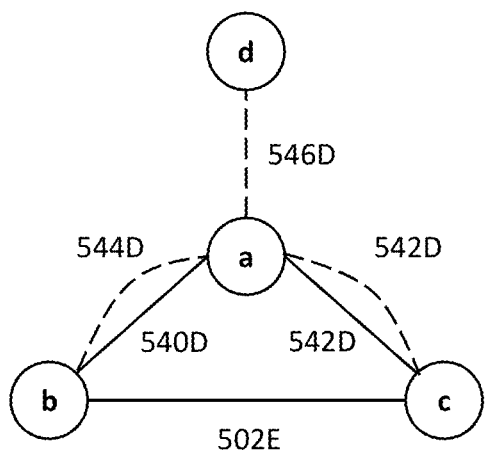
FIG. 5G illustrates another arrangement of the comparison graph illustrated in FIG. 5F in one or more embodiments.

FIG. 5G illustrates another arrangement of the comparison graph illustrated in FIG. 5F in one or more embodiments. This arrangement of the comparison graph illustrated in FIG. 5F is equivalent to the comparison graph illustrated in FIG. 5F.

Figures 5H, 5I:
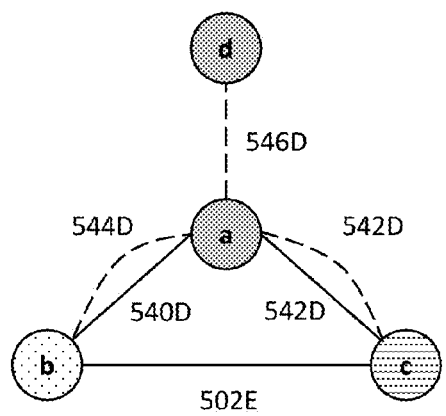
FIG. 5H illustrates an example of a truth table candidate for the comparison graph illustrated in FIG. 5G in one or more embodiments.
FIG. 5I illustrates an example of coloring the comparison graph illustrated in FIG. 5G in one or more embodiments.

FIG. 5H illustrates an example of a truth table candidate for the comparison graph illustrated in FIG. 5G in one or more embodiments. During the first clock cycle, input signals "a" and "b" may be respectively assigned the values of "0" and "1" while satisfying the data flow "a=b" for the first clock cycle. During the second clock cycle, input signal "b" remains at the assigned value "0" because of the simple flop architecture for input signal "b". As a result, input signals "a" and "c" may be respectively assigned the values of "1" and "0" while satisfying the data flow "a≠b & a=c" for the second clock cycle.

During the third clock cycle, input signal "b" still remains at the assigned value "0" due to the simple flop architecture for input signal "b". Therefore, input signals "a", "c", and "d" may be respectively assigned the values of "2", "1", and "2" while satisfying the data flow "a≠b & a≠c & a=d" for the third clock cycle. It shall be noted that although one or more of the input signals may never have the values listed in the table illustrated in FIG. 5H, these distinct input signals "a", "b", "c", and "d" may nevertheless be assigned with these simpler token values while the comparison graph still satisfies all the extracted data flows without using the actual values of any of these input signals "a", "b", "c", and "d".

In some embodiments, assignment of token values may be performed in such a way that the minimum number of distinct token values is used to satisfy the extracted data flows. In this example, the comparison graph only needs three distinct token values to represent the four distinct input signals or tokens. Three distinct token values may be coded with a 2-bit variable that may produce four distinct values. Therefore, the variable widths for verifying the portion of the electronic design for which the comparison graph is constructed may be reduced to 2-bit.

Depending on the original variable width of these four tokens, these techniques described herein may provide a substantial reduction in the domain size for the portion of the electronic design under verification. For example, if each of the four tokens is a 16-bit signal, these techniques reduce the variable width from 16-bit to 2-bit and the total bit count from 64 (16×4) to 8 (2×4). The techniques may thus be used to verify the portion of the electronic design by using the reduced variable width tokens, rather than the original signals, to provide the advantage of considerable savings and conservation in the computation cycles and/or the memory footprint required for successful verification of the portion of the electronic design.

FIG. 5I illustrates an example of coloring the comparison graph illustrated in FIG. 5G in one or more embodiments. More specifically, FIG. 5I may be derived from the uncolored comparison graph in FIG. 5G by coloring tokens connected only with equality edges with the same color and tokens connected by at least one inequality edges with different colors. As a result, tokens "a" and "d" may be colored with the same color because these two tokens are connected only with an equality edge 546D.

Tokens "a" and "b" are connected by an inequality edge 540D and thus may be colored with different colors. Similarly, tokens "a" and "c" are connected by an inequality edge 542D and thus may be colored with different colors; and tokens "b" and "c" are connected by an inequality edge 502E and thus may be colored with different colors. Therefore, the comparison graph illustrated in FIG. 5G may be colored with a total number of three different colors which also matches the number of distinct token values illustrated in FIG. 5H. It shall be noted that coloring a comparison graph does not necessarily require using actual colors or patterns to graphically represent the comparison graph or a portion thereof. Rather, coloring a comparison graph may involve assigning distinct numerical or symbolic values to tokens in a comparison graph in a way that may or may not be visible in a user interface while satisfying the extracted data flows or properties to be proved or disproved for the portion of the electronic design under verification.

System Architecture Overview

Figure 6:
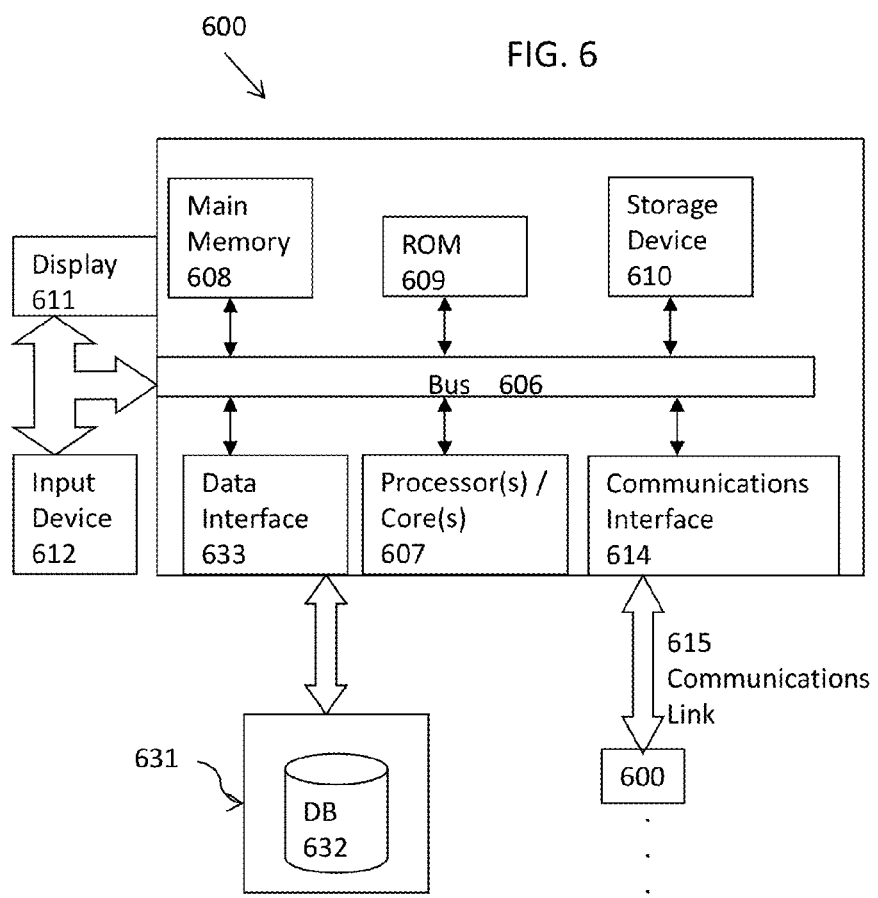
FIG. 6 illustrates a computerized system on which a method for simplifying an electronic design for verification by domain reduction may be implemented.

FIG. 6 illustrates a block diagram of an illustrative computing system 600 suitable for simplifying an electronic design for verification by domain reduction as described in the preceding paragraphs with reference to various figures. Computer system 600 includes a bus 606 or other communication mechanism for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computing system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, various identifications, determinations, groupings, processing, markings, detection, analyses, or simulations, etc. may be performed by one or more mechanisms (e.g., one or more mechanisms described in FIG. 1A) including or functioning in tandem with one or more processors, one or more processor cores, or combination thereof.

A mechanisms described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computing system 600 operates in conjunction with a data storage system 631, e.g., a data storage system 631 that includes a database 632 that is readily accessible by the computing system 600. The computing system 600 communicates with the data storage system 631 through a data interface 633. A data interface 633, which is coupled with the bus 606, transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for simplifying an electronic design for verification by domain reduction, comprising:

extracting, with an extraction mechanism that is stored at least partially in memory and includes or functions in conjunction with a computer processor or a processor core, one or more data flows for at least a portion of an electronic design under verification;

constructing a comparison graph comprising tokens and edges for the at least the portion of the electronic design;

reducing at least one original variable width of a plurality of signals in the one or more data flows to a reduced variable width at least by coloring the comparison graph with a number of colors; and performing one or more analyses for the plurality of signals in the at least the portion of the electronic design using at least the reduced variable width, rather than the at least one original variable width.

2. The computer implemented method of claim 1, further comprising:

reducing the domain size of the at least the portion of the electronic design based in part or in whole upon the number of colors;

identifying the at least the portion of the electronic design; and identifying the tokens from the one or more data flows.

3. The computer implemented method of claim 2, wherein the at least the portion of the electronic design does not include electronic design components that transform values of the tokens.

4. The computer implemented method of claim 1, further comprising:

identifying an electronic design component and a type of an operation for the electronic design component;

identifying a first input for the electronic design component; and identifying one or more second inputs for the electronic design component that performs the operation on the first input and the one or more second inputs.

5. The computer implemented method of claim 4, further comprising:

updating the comparison graph by adding at least one edge between the first input and at least one second input of the one or more second inputs.

6. The computer implemented method of claim 4, further comprising:

identifying a first fanin cone for the first input;
identifying one or more third tokens in the first fanin cone for the first input; and
updating the comparison graph by adding at least one edge between at least one second input of the one or more second inputs and at least one third token of the one or more third tokens.

7. The computer implemented method of claim 4, further comprising:
identifying at least one second fanin cone for the one or more second inputs;
identifying one or more fourth tokens in the at least one second fanin cone for the one or more second inputs; and
updating the comparison graph by adding at least one edge between the first input and at least one fourth token of the one or more fourth tokens.

8. The computer implemented method of claim 1, further comprising:
identifying one or more implied relations for the at least the portion of the electronic design based in part or in whole upon the one or more data flows;
identifying at least two tokens in the comparison graph based in part or in whole upon the one or more implied relations, wherein the at least two tokens are not directly or indirectly compared according to the one or more data flows; and
updating the comparison graph by adding an implied edge between the at least two tokens.

9. The computer implemented method of claim 1, further comprising:
determining whether the comparison graph includes at least one conflict cycle; and
applying one or more conflict resolution techniques.

10. The computer implemented method of claim 1, coloring the comparison graph further comprising:
determining the number of different colors for coloring the comparison graph based in part or in whole upon the one or more data flows; and
assigning colors to the tokens in the comparison graph according to the one or more data flows.

11. The computer implemented method of claim 1, further comprising:
identifying a first clock cycle and a first data flow of the one or more data flows for the first clock cycle; and
identifying one or more first tokens in the first data flow for the first clock cycle.

12. The computer implemented method of claim 11, further comprising:
identifying one or more first comparisons for the one or more first tokens from the first data flow of the first clock cycle; and
generating a first comparison sub-graph for the first clock cycle at least by using the one or more first tokens and one or more edges connecting at least some of the one or more first tokens based in part or in whole upon the one or more first comparisons.

13. The computer implemented method of claim 12, further comprising:
identifying a second clock cycle and a second data flow of the one or more data flows of the second clock cycle; and
identifying one or more second tokens in the second data flow for the second clock cycle.

14. The computer implemented method of claim 13, further comprising:

identifying one or more second comparisons for the one or more second tokens from the second data flow of the second clock cycle; and
generating a second comparison sub-graph for the second clock cycle at least by using the one or more second tokens and one or more edges connecting at least some of the one or more second tokens based in part or in whole upon the one or more second comparisons.

15. The computer implemented method of claim 14, further comprising:
unrolling the at least the portion of the electronic design by adding at least one additional edge to connect the first comparison sub-graph and the second comparison sub-graph.

16. The computer implemented method of claim 14, further comprising:
identifying one or more implied relations between a first token in the first comparison sub-graph and a second token in the second comparison sub-graph; and
updating the comparison graph by adding at least one implied edge based in part or in whole upon the one or more implied relations.

17. The computer implemented method of claim 14, further comprising:
collapsing the first comparison sub-graph upon the second comparison sub-graph for constructing the comparison graph.

18. The computer implemented method of claim 14, further comprising:
determining whether the comparison graph includes at least one conflict cycle; and
applying one or more conflict resolution techniques.

19. The computer implemented method of claim 1, coloring the comparison graph further comprising:
determining a minimum number of different colors that, when used to color the comparison graph, satisfies the one or more data flows; and
assigning the minimum number of different colors to the tokens of the comparison graph based in part or in whole upon the one or more data flows.

20. The computer implemented method of claim 19, further comprising:
determining a total count of bits for representing the tokens based in part or in whole upon the minimum number of different colors;
representing the minimum number of different colors with a set of numbers; and
reducing the domain size of the at least the portion of the electronic design by using the set of numbers.

21. A system for simplifying an electronic design for verification by domain reduction, comprising:
at least one micro-processor or processor core of a computing system;
a non-transitory computer accessible storage medium storing thereupon program code that includes a sequence of instructions that, when executed by the at least one micro-processor or processor core of the computing system, causes the at least one micro-processor or processor core at least to:
extract one or more data flows for at least a portion of an electronic design under verification;
construct a comparison graph comprising vertices and edges for the at least the portion of the electronic design;
reduce at least one original variable width of a plurality of signals in the one or more data flows to a reduced variable width at least by coloring the comparison graph with a number of colors; and perform one or more analyses for the plurality of signals in the at least the portion of the electronic design using at least the reduced variable width, rather than the at least one original variable width.

22. The system of claim 21, wherein the program code includes further instructions that, when executed by the at least one micro-processor or processor core, cause the at least one processor or processor core to:

reduce the domain size of the at least the portion of the electronic design based in part or in whole upon the number of colors;

identify an electronic design component and a type of an operation for the electronic design component;

identify a first input for the electronic design component; and identify one or more second inputs for the electronic design component that performs the operation on the first input and the one or more second inputs.

23. The system of claim 22, wherein the program code includes further instructions that, when executed by the at least one micro-processor or processor core, cause the at least one processor or processor core to:

identify a first fanin cone for the first input;

identify one or more third tokens in the first fanin cone for the first input; and update the comparison graph by adding at least one edge between at least one second input of the one or more second inputs and at least one third token of the one or more third tokens.

24. The system of claim 21, wherein the program code includes further instructions that, when executed by the at least one micro-processor or processor core, cause the at least one processor or processor core to:

identify one or more implied relations for the at least the portion of the electronic design based in part or in whole upon the one or more data flows;

identify at least two tokens in the comparison graph based in part or in whole upon the one or more implied relations, wherein the at least two tokens are not directly or indirectly compared according to the one or more data flows; and update the comparison graph by adding an implied edge between the at least two tokens.

25. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for simplifying an electronic design for verification by domain reduction, the set of acts comprising:

extracting one or more data flows for at least a portion of an electronic design under verification;

constructing a comparison graph comprising tokens and edges for the at least the portion of the electronic design;

reducing at least one original variable width of a plurality of signals in the one or more data flows to a reduced variable width at least by coloring the comparison graph with a number of colors; and performing one or more analyses for the plurality of signals in the at least the portion of the electronic design using at least the reduced variable width, rather than the at least one original variable width.

26. The article of manufacture of claim 25, the set of acts further comprising:

reducing the domain size of the at least the portion of the electronic design based in part or in whole upon the number of colors;

determining whether the comparison graph includes at least one conflict cycle; and applying one or more conflict resolution techniques.

27. The article of manufacture of claim 25, the set of acts further comprising:

identifying a first clock cycle and a first data flow of the one or more data flows for the first clock cycle;

identifying one or more first tokens in the first data flow for the first clock cycle;

identifying one or more first comparisons for the one or more first tokens from the first data flow of the first clock cycle; and generating a first comparison sub-graph for the first clock cycle at least by using the one or more first tokens and one or more edges connecting at least some of the one or more first tokens based in part or in whole upon the one or more first comparisons.

28. The article of manufacture of claim 27, the set of acts further comprising:

identifying a second clock cycle and a second data flow of the one or more data flows of the second clock cycle;

identifying one or more second tokens in the second data flow for the second clock cycle;

identifying one or more second comparisons for the one or more second tokens from the second data flow of the second clock cycle; and generating a second comparison sub-graph for the second clock cycle at least by using the one or more second tokens and one or more edges connecting at least some of the one or more second tokens based in part or in whole upon the one or more second comparisons.

* * * * *